(12) United States Patent
Ishikawa et al.

(10) Patent No.: US 11,243,463 B2
(45) Date of Patent: Feb. 8, 2022

(54) SUPPORTING FRAME FOR PELLICLE, PELLICLE, METHOD FOR MANUFACTURING SAME, EXPOSURE MASTER USING SAME, AND METHOD FOR MANUFACTURING SEMICONDUCTOR DEVICE

(71) Applicant: MITSUI CHEMICALS, INC., Tokyo (JP)

(72) Inventors: Akira Ishikawa, Ichihara (JP); Atsushi Okubo, Tokyo (JP); Yosuke Ono, Sodegaura (JP); Kazuo Kohmura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 17/033,076

(22) Filed: Sep. 25, 2020

(65) Prior Publication Data
US 2021/0011372 A1    Jan. 14, 2021

Related U.S. Application Data

(63) Continuation of application No. PCT/JP2019/010958, filed on Mar. 15, 2019.

(30) Foreign Application Priority Data

Mar. 27, 2018 (JP) .............................. JP2018-059416

(51) Int. Cl.
*G03F 1/64* (2012.01)
*G03F 7/20* (2006.01)

(52) U.S. Cl.
CPC ............ *G03F 1/64* (2013.01); *G03F 7/70191* (2013.01); *G03F 7/70866* (2013.01); *G03F 7/70916* (2013.01); *G03F 7/70983* (2013.01)

(58) Field of Classification Search
CPC .... G03F 1/64; G03F 7/70191; G03F 7/70866; G03F 7/70916; G03F 7/70983
(Continued)

(56) References Cited

U.S. PATENT DOCUMENTS 5,422,704 A * 6/1995 Sego .......................... G03F 1/64
355/30
5,529,819 A * 6/1996 Campi, Jr. ................ G03F 1/64
355/30
(Continued)

FOREIGN PATENT DOCUMENTS

JP    2016191902 A    11/2016
JP    2017083791 A     5/2017
(Continued)

OTHER PUBLICATIONS

Machine Translation JP 2017-083791.*
(Continued)

*Primary Examiner* — Colin W Kreutzer
(74) *Attorney, Agent, or Firm* — Buchanan, Ingersoll & Rooney PC

(57) ABSTRACT

Provided is a supporting frame in which a vent hole detachably arranging a filter and to which a pellicle film for extreme ultraviolet lithography can be attached. A support frame according to an embodiment of the present invention is a support frame for arranging a pellicle film, the support frame has a through hole being made from a hole extending along a first direction, the first direction being almost parallel to a surface direction of the pellicle film, and a hole extending along a second direction, the second direction not being parallel to the first direction; and the support frame includes a filter, the filter arranged at an inside of the through hole or at an end of the through hole, and the filter is arranged apart from the pellicle film.

17 Claims, 30 Drawing Sheets

(58) Field of Classification Search
USPC ........ 355/30, 53, 67, 69, 72; 359/507; 430/5
See application file for complete search history.

(56) References Cited

U.S. PATENT DOCUMENTS

| | | |
|---|---|---|
| 2008/0024751 A1 | 1/2008 | Hirayanagi |
| 2016/0291460 A1 | 10/2016 | Shirasaki |
| 2017/0184956 A1 | 6/2017 | Kohmura et al. |
| 2017/0184957 A1 | 6/2017 | Kohmura et al. |
| 2017/0192349 A1 | 7/2017 | Kohmura et al. |
| 2019/0094683 A1* | 3/2019 | Yoo .......................... G03F 1/22 |
| 2021/0080824 A1* | 3/2021 | Ishikawa ................... G03F 1/64 |

FOREIGN PATENT DOCUMENTS

| | | |
|---|---|---|
| WO | 2008007521 A1 | 1/2008 |
| WO | 2015166927 A1 | 11/2015 |
| WO | 2016043292 A1 | 3/2016 |
| WO | 2016043301 A1 | 3/2016 |

OTHER PUBLICATIONS

International Search Report (with an English translation thereof) and Written Opinion dated May 7, 2019, by the Japan patent Office in corresponding International Patent Application No. PCT/JP2019/010958. (10 pages).

* cited by examiner

111F

111F

SUPPORTING FRAME FOR PELLICLE, PELLICLE, METHOD FOR MANUFACTURING SAME, EXPOSURE MASTER USING SAME, AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2018-059416, filed on Mar. 27, 2018, and PCT Application No. PCT/JP2019/010958, filed on Mar. 15, 2019, the entire contents of which are incorporated herein by reference.

FIELD

A present invention relates to a photomask or a reticle used when manufacturing a semiconductor device or the like by a lithography technique (hereinafter, also referred to as a "photomask") and a pellicle or the like which is a dustproof cover for the photomask for preventing dust from adhering thereto. In particular, the present invention relates to a support frame for a pellicle which has an ultrathin film for an extreme ultraviolet (Extreme Ultraviolet: EUV) lithography, the pellicle and a method of manufacturing the same, an exposure master plate using the same, and a method of manufacturing a semiconductor device.

BACKGROUND

A semiconductor element is manufactured through a process called a lithography. In lithography, an exposure device called a scanner or a stepper is used to irradiate the mask on which a circuit pattern is drawn with an exposure light to transfer the circuit pattern to a semiconductor wafer on which a photoresist is applied. When a foreign matter such as the dust or the like adheres to the mask, the shadow of the foreign matter is transferred to the semiconductor wafer, and the circuit pattern is not accurately transferred. As a result, the semiconductor element may not operate normally and become defective.

On the other hand, it is known to attach a pellicle containing a frame body to which a pellicle film is attached to the mask, thereby causing the foreign matter such as the dust to adhere to the pellicle film and preventing the foreign matter from adhering to the mask. A focal point of the exposure light of the exposure device is set on the mask surface and the semiconductor wafer surface and not on the pellicle film surface. Therefore, the shadow of the foreign matter adhering to the pellicle film does not form an image on the semi-conductor wafer. Therefore, when the foreign matter adheres to the pellicle film, the degree of disturbance of the transfer of the circuit pattern is greatly reduced as compared with the case where the foreign matter adheres to the masks, and the incidence of defective occurrence rate of the semiconductor element is remarkably suppressed.

The pellicle film used for the pellicle is required to have high transmission for transmitting the exposure light. If the light transmission of the pellicle film is low, the strength of the exposure light from the mask on which the circuit pattern is formed is reduced, and the photoresist formed on the semiconductor wafer is not sufficiently exposed.

By the present, the wavelength of the lithography advances in the shortening, and the development of the EUV lithography is advanced as a lithography technology of the next generation. The EUV light refers to light having wavelengths of a soft X-ray region or a vacuum-ultraviolet light region, and refers to light having a wavelength of about 13.5 nm±0.3 nm. The EUV light is readily absorbed by all materials, and the EUV lithography therefore requires an exposure with the vacuums in the exposure device.

SUMMARY

As mentioned above, unlike conventional lithography, in the EUV lithography, exposure is performed under the vacuum, so it was believed that attachment of a pellicle to a photomask was not essential. However, since it is a conventional fine process, it has been found that attachment of the pellicle on the photomask is essential from the viewpoint of preventing contamination of the photomask, etc. However, since the EUV light is easily absorbed by all materials, the pellicle film arranged on the pellicle needs to be a nanometer order film, which is not conventionally used.

Furthermore, since it was initially believed that attachment of the pellicle to the photomask was not essential, there is only about 3.0 mm of space to attach the pellicle to the photomask in the EUV exposure device currently being developed. However, to ensure space in the exposure device for the installation of the conventional pellicle with a height of 5 mm or more, an optical system needs to be redesigned, which delays the development of the EUV-lithography. Therefore, it is necessary to newly design the pellicle having a height of about half or less of the conventional pellicle.

Because of the exposure under the vacuum, the pressure differential between the closed space formed by the photomask and the pellicle (inside the pellicle) and the outside of the pellicle can occur, causing the pellicle film to sag or bulge. As a solution, it is conceivable to provide a vent hole. However, because the installation space of the pellicle is greatly limited, adequate ventilation through the vent hole located at the frame body of the pellicle is required to prevent damages to the pellicle film of the nanometer order. A filter must be equipped in middle of the vent hole halfway to prevent the foreign matter from entering inside of the pellicle. However, the installation space of the pellicle is greatly limited and the allowable height of the frame body is greatly limited. Therefore, an unconventional design is required to arrange the filter in the frame body.

In order to solve the above-mentioned problems, it is an object of the present invention to provide a support frame in which the vent hole and the filter are arranged and the pellicle film for the extreme ultraviolet light lithography can be arranged, a pellicle in which the pellicle film for the extreme ultraviolet light lithography is arranged in the support frame, and a manufacturing method of the same, and an exposure master plate using these, and a method of manufacturing the semiconductor device.

A support frame according to an embodiment of the present invention is a support frame for arranging a pellicle film, the support frame has one or more of through holes being made from a first hole extending along a first direction, the first direction being almost parallel to a surface direction of the pellicle film, and a second hole extending along a second direction, the second direction not being parallel to the first direction; and the support frame includes one or more of filters, the filter is arranged at an inside of the through hole or at an end of the through hole, and the filter is arranged apart from the pellicle film.

By the support frame according to an embodiment of the present invention, it takes less time to be evacuated, and the degradation of the filter can be suppressed. In addition, when the filter is provided at the end of through hole, it is easier to attach and detach the filter. The pellicle film can be arranged on the support frame.

In an embodiment of the present invention, the support frame includes a plurality of layers, the plurality of layers includes a bottom plate having a frame shape, a first thin plate having a frame shape and a second thin plate having a frame shape, the first and second thin plates arranged above the bottom plate, the first thin plate has one or more of first concave parts connected to an inner edge of the first thin plate and extending along the first direction, the second thin plate has one or more of second concave parts connected to an outer edge of the second thin plate and extending along the first direction, and the second hole extending to the second direction may be formed by at least partially overlapping the first concave part and the second concave part.

By the support frame according to an embodiment of the present invention, it takes less time to be evacuated, and the degradation of the filter can be suppressed. Further, it is possible to easily form a three-dimensional shape of the vent hole by stacking a plurality of frame-shaped plates.

In an embodiment of the present invention, the first thin plate may be arranged on the bottom plate, and the second thin plate may be arranged above the first thin plate.

By the support frame according to an embodiment of the present invention, it takes less time to be evacuated, and the degradation of the filter can be suppressed. The pellicle film can be provided on the support frame. Further, it is possible to easily form a three-dimensional shape of the vent hole by stacking a plurality of the frame-shaped plates.

In an embodiment of the present invention, the second thin plate may be arranged on the bottom plate, and the first thin plate may be arranged above the second thin plate.

By the support frame according to an embodiment of the present invention, it takes less time to be evacuated, and the degradation of the filter can be suppressed. The pellicle film can be provided on the support frame. Further, it is possible to easily form a three-dimensional shape of the vent hole by stacking a plurality of the frame-shaped plates.

In an embodiment of the present invention, one or more spacer layers may be included between the first thin plate and the second thin plate.

By the support frame according to an embodiment of the present invention, it takes less time to be evacuated, and the degradation of the filter can be suppressed. The pellicle film can be provided on the support frame. Further, it is possible to easily form a three-dimensional shape of the vent hole by stacking a plurality of the frame-shaped plates.

In an embodiment of the present invention, the first thin plate may be arranged above the bottom plate, and the first thin plate may have a plurality of the first concave parts extending in the first direction.

By the support frame according to an embodiment of the present invention, it takes less time to be evacuated, and the degradation of the filter is suppressed. The pellicle film can be arranged on the support frame. In addition, since the first thin plate has a plurality of a first concave part, distortion of the bottom plate and the spacer layer can be suppressed.

In an embodiment of the present invention, the second thin plate may be arranged above the bottom plate, and the second thin plate has a plurality of the second concave parts extending in the first direction.

By the support frame according to an embodiment of the present invention, it takes less time to be evacuated, and the degradation of the filter can be suppressed. The pellicle film can be arranged on the support frame. In addition, since the second thin plate has the plurality of a second concave parts, distortion of the bottom plate and the spacer layer can be suppressed.

In an embodiment of the present invention, each of a plurality of the filter is arranged to each of the plurality of the through hole, wherein a total area of the plurality of the filters is 100 mm$^2$ or more and 2000 mm$^2$ or less.

By the support frame according to an embodiment of the present invention, it takes less time to be evacuated, and the degradation of the filter can be suppressed. The pellicle film can be arranged on the support frame.

In an embodiment of the present invention, a surface direction of one or more of the filters is almost parallel to the surface direction of the pellicle film.

By the support frame according to the embodiment of the present invention, it takes less time to be evacuated, and the degradation of the filter can be suppressed. The pellicle film can be arranged on the support frame.

In an embodiment of the present invention, one or more of the filters may have an initial pressure loss of 100 Pa or more and 550 Pa or less, and a particle capture rate of 99.7% or more and 100% or less with respect to particles having a particle diameter of 0.15 μm or more and 0.3 μm or less.

By the support frame according to an embodiment of the present invention, even a high-performance filter, the total area becomes large, and the time required to be evacuated is shortened. In addition, the pellicle film for the extreme ultraviolet light lithography can be arranged.

In an embodiment of the present invention, a thickness from a surface of the frame body in which the pellicle film arranged to an opposite surface of the frame body is 3.0 mm or less.

By the support frame according to an embodiment of the present invention, it is easy to arrange to the EUV exposure device.

In an embodiment of the present invention, the pellicle is provided, wherein the pellicle film is arranged on any support frame described above.

By the pellicle according to an embodiment of the present invention, it takes less time to be evacuated, and the degradation of the filter can be suppressed.

In an embodiment of the present invention, the pellicle film may be arranged on the support frame via the frame body arranged on one surface of the pellicle film.

By the support frame according to an embodiment of the present invention, since the pellicle film is supported by the frame body, it can be attached to and detached from the support frame, and attachment and detachment of the filter can be facilitated.

In an embodiment of the present invention, provided is an exposure master plate that comprises a master plate, and the pellicle formed on a surface of the master plate with a pattern.

By the exposure master plate according to an embodiment of the present invention, it takes less time to be evacuated, and the degradation of the filter can be suppressed.

In an embodiment of the present invention, provided is an exposure device having the above described exposure master plate.

By the exposure device according to the embodiment of the present invention, it takes less time to be evacuated, and the degradation of the filter can be suppressed.

In an embodiment of the present invention, provided is an exposure device that comprises a light source for emitting the exposure light, an exposure master plate, and an optical system for guiding the exposure light emitted from the light source to the exposure master plate, the exposure master plate is arranged so that the exposure light emitted from the light source transmits the pellicle film and irradiates to the exposure master plate.

The exposure device according to an embodiment of the present invention, it takes less time to be evacuated, and the degradation of the filter can be suppressed.

In an embodiment of the present invention, the exposure light is the EUV light.

By the exposure device according to an embodiment of the present invention, it takes less time to be evacuated, and the degradation of the filter can be suppressed.

In an embodiment of the present invention, provided is a method of manufacturing a semiconductor device that comprises a step of transmitting an exposure light emitted from a light source through the pellicle film of the exposure master plate and irradiating the exposure light to the master plate, and reflecting the exposure light on the master plate, and a step of transmitting the exposure light reflected by the master plate through the pellicle film and irradiating the exposure light on a sensitive substrate, and thereby exposing the sensitive substrate in patterned shape.

By the manufacturing process of semiconductor device according to an embodiment of the present invention, it takes less time to be evacuated, and the degradation of the filter can be suppressed.

In an embodiment of the present invention, provided is a method of manufacturing a semiconductor device, and the exposure light is EUV-light.

By the manufacturing process of semiconductor device according to an embodiment of the present invention, it takes less time to be evacuated, and the degradation of the filter can be suppressed.

REFERENCE SIGNS LIST

Figure 1A:
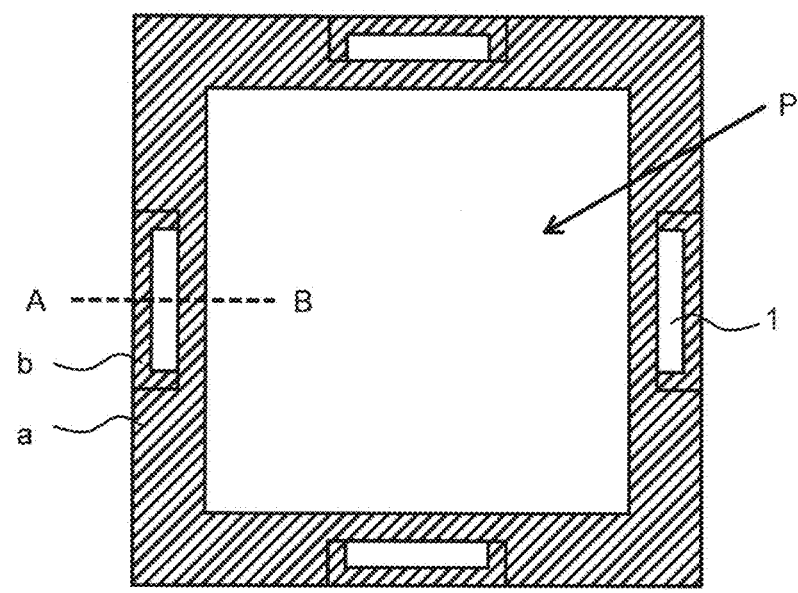
FIG. 1A is a schematic diagram of a frame body 10 according to an embodiment and shows a top view.

1: vent hole, 3: hole, 3A: hole, 3B: hole, 5: hole, 10: frame body, 10A: frame body, 12: bottom plate layer, 13: plate layer with vent hole, 13A: plate layer with vent hole, 13B: plate layer with vent hole, 13C: plate layer with vent hole, 13D: plate layer with vent hole, 13D-1: comb-shaped structure, 13E: plate layer with vent hole, 13E-1: comb-shaped structure, 14: concave part (concave shape), 14A: concave part (concave shape), 14B: concave part, 14C: concave part, 17: plate layer with vent hole, 17A: plate layer with vent hole, 17B: plate layer with vent hole, 17C: plate layer with vent hole, 18: through hole, 18A: through hole, 19: concave part (concave shape), 19A: concave part (concave shape), 25: spacer layer, 25A: spacer layer, 30: filter, 30A: filter, 36: second spacer layer, 36A: second spacer layer, 38: through hole, 38A: through hole, 39: adhesive layer, 41: top plate, 48: spacer layer, 48A: third spacer layer, 100: pellicle, 100A: pellicle, 100B: pellicle, 102: pellicle film, 104: first frame body, 111: support frame, 111A: support frame, 111B: support frame, 111C: support frame, 111D support frame, 111E: support frame, 111F: support frame, 111G: support frame, 111H: support frame, 111I: support frame, 111J: support frame, 111K: support frame, 111L: support frame, 180: exposure device, 181: exposure master plate, 182: light source, 183: lighting optical system, 184: master plate, 185: filter window, 186: filter window, 187: sensitive substrate, 188: projection optical system, 189: multilayer mirror, 190: multilayer mirror, 191: multilayer film mirror

DESCRIPTION OF EMBODIMENTS

Hereinafter, embodiments of the present invention will be described below with reference to FIGS. 1A to 30. However, the present invention can be implemented in many different aspects, and should not be construed as being limited to the description of the following embodiments. In addition, although the drawings may schematically represent the width, thickness, shape, and the like of each portion as compared with actual aspects for the sake of clarity of description, the drawings are merely an example and do not limit the interpretation of the present invention. In this specification and each drawing, the same reference numerals are assigned to the same elements as those described above with reference to the preceding drawings, and detailed description thereof may be omitted as appropriate.

Definitions

In this specification, when a member or region is "above (or below)" another member or region, unless otherwise limited, this includes not only being directly above (or below) another member or region, but also being over (or under) another member or region, i.e., including a case where another component is included above (or below) another member or region and between the member or region and another member or region.

In this specification, the extreme ultraviolet light (EUV light) refers to light having a wavelength of 5 nm or more and 30 nm or less. The wavelength of the EUV light is preferably greater than or equal to 5 nm and less than or equal to 14 nm.

In the specification, a pellicle means an object having a pellicle film and a support unit that supports the pellicle film on one surface of the pellicle film and is connected to a master plate. The pellicle film means a thin film used in the pellicle. The support unit includes at least a support frame connected to the master plate. The support frame comprises a vent hole. When the pellicle is placed on the master plate, the vent hole is a hole which allows ventilation of the inside and the outside of the closed space formed by the pellicle and the master plate. A filter is located at one end of the vent hole or within the vent hole. The support frame is a frame body with the filter placed at one end of the vent hole or inside the vent hole. The support unit may be the support frame to extend the pellicle film, or it may further have a separate frame body connected to the pellicle film and the support frame. When the support unit is composed of the support frame and another frame body, the frame body that extends the pellicle film is called a first frame body, the frame body that supports the first frame body and constitutes the support frame located on the master plate side is called a second frame body. A structure in which the pellicle film is extended on the first frame body is called a pellicle frame body. Therefore, the pellicle can be defined as a structure in which the pellicle film and the support unit are connected, or a structure in which the pellicle frame body and the support frame are connected. It should be noted that the support frame does not exclude two or more frame body as long as they can be arranged in the space within an exposure device.

In the present specification, the term "surface" is not limited to a plane, and includes curved surface.

[Problems of the Prior Art Found in the Invention]

If area of the filter on the support unit of the pellicle is small when evacuating the inside of a lithographic device using an EUV pellicle, the air is difficult to pass through the filter, and it takes relatively long time to create a vacuum inside the pellicle. In particular, since the height of the support unit itself is low, the filter area is limited to in the type of providing a hole in side surface direction of the support unit as described in International Patent Publication No. 2016/043292 described in the prior art, therefore, it was found that there is a problem for further shortening the time required to reach the vacuum. Further, since the filter is exposed to an exposure surface in the type of providing the hole of longitudinal direction of the support unit as in International Patent Publication No. 2016/043301 described in the prior art, therefore, it was found that there is a problem in which the EUV light hits the filter and the degradation of the filter progresses relatively quickly. Furthermore, in International Patent Publication No. 2016/043301 which is a prior art, drilling is required in the Si wafer which is a starting substrate of the pellicle film for an EUV such as SiN, p-Si, SiC, it was found that the fabrication process is relatively complicated and expensive.

[Configuration According to an Embodiment of the Present Invention]

Figure 1B:
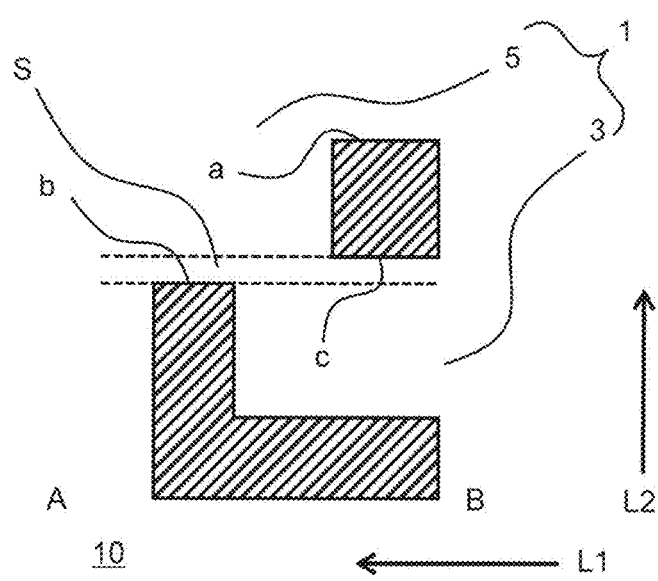
FIG. 1B shows a cross-sectional view of the AB-line in FIG. 1A.

Therefore, the present inventors envisaged that a vent hole 1 (through hole) in the support unit is a hole 3 extending in transverse direction of a frame body 10 in the inside of the frame body 10 constituting the support unit (It is a side where the closed space is formed when the pellicle is attached to the master plate; the closed space portion when the pellicle is formed on the master plate is indicated by the arrow P), or side surface direction (It is a direction almost parallel to a surface direction of the pellicle film and also referred to as a first direction L1), and is bent up to the outside of the frame body 10, and a hole 5 extending in a second direction L2 intersecting with the first direction L1, is thereby the vent hole 1 (a through hole) which penetrates to the outside of a closed space part P. FIG. 1A is a top view of the frame body 10 (a schematic view of the surface side where the pellicle frame body is arranged), and FIG. 1B is a cross-sectional view of the frame body 10 in the line segment AB shown in FIG. 1A. FIG. 1B shows a view in which the vent hole 1 is provided by an integral member. This can be produced, for example, by etching, machining, or the like to provide the vent hole 1 in the frame body.

Figure 2A:
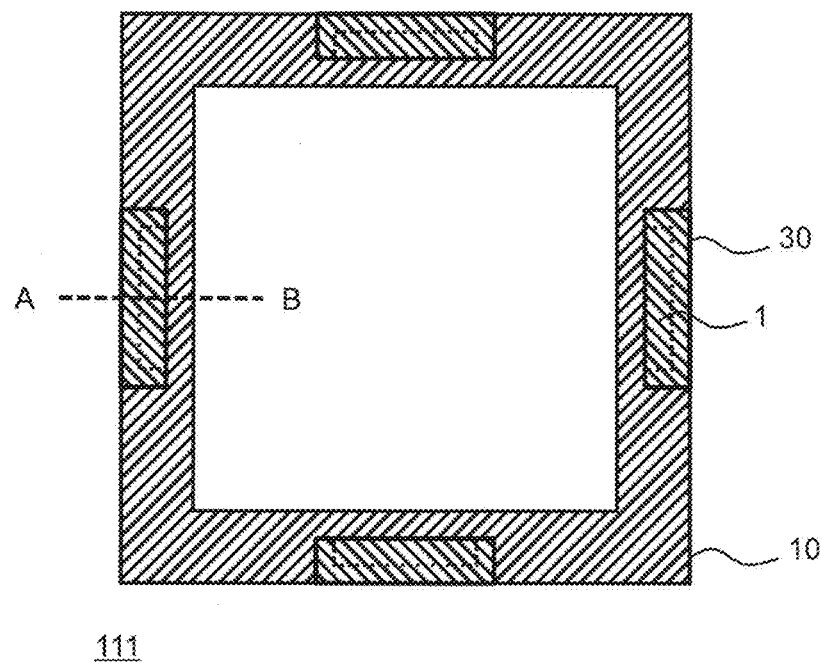
FIG. 2A is a schematic diagram of a support frame 111 according to an embodiment and shows a top view.
Figure 2B:
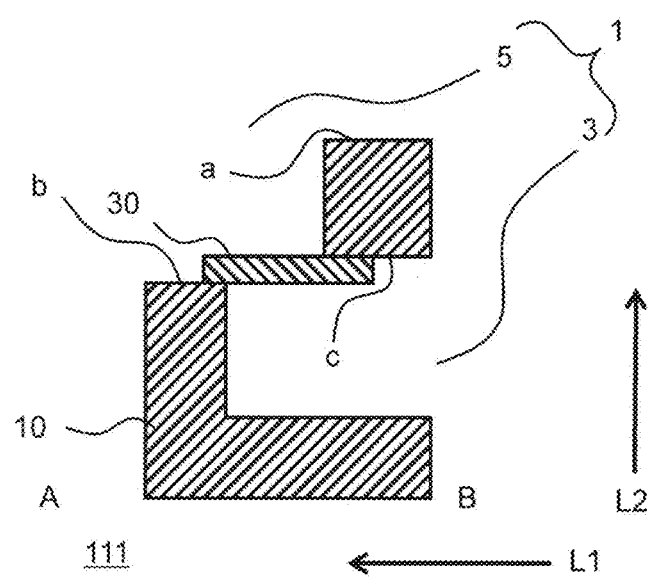
FIG. 2B shows a cross-sectional view of the AB-line in FIG. 2A.

To locate a filter 30 shown in FIGS. 2A and 2B, in an embodiment, the frame body 10 has a stepped structure with a partially cut away portion of a top surface a. In the present embodiment, a surface b and a surface c are arranged as surfaces for attaching the filter 30 to the frame body 10. The surface b is a surface of the edge of the notched stepped structure, the surface c, in the notched stepped structure, is the lower surface facing the upper surface a. The surface b and the surface c have a space S for arranging the filter 30.

The support frame 111 is formed by attaching the filter 30 to any part of this vent hole 1 (an outer vent, which is the outer end of the hole 5, an inner vent, which is the inner end of the hole 3, the interior of the hole 5, or the interior of hole 3). FIG. 2A is a top view of the support frame 111 in which the filter 30 is arranged on the frame body 10, FIG. 2B is cross-sectional view of the support frame 111 at the position where the filter 30 is arranged (line segment AB shown in FIG. 2A). By way of example, the filter 30 is attached to the frame body 10 via the surface b and the surface c. That is, the filter 30 is provided at the end of the through hole on the hole side extending in the second direction. In FIGS. 2A and 2B, the filter 30 is arranged at the outlet portion (outer vent) of vent hole 1, which is a portion that becomes the outside of the closed space portion P when an exposure master plate is connected to the pellicle, but is not limited to this position and can be installed at any location of the hole 5. The pellicle can be obtained by arranging the pellicle film or the pellicle frame body, which will be described later, on the upper surface a of the support frame 111. Thus, in an embodiment of the pellicle, the filter 30 is spaced from the pellicle film. The filter 30 is arranged below the pellicle film (the exposure master plate) and spaced apart from the pellicle film, and the frame body 10 makes an exposure light less likely to hit. Therefore, the filter 30 is hardly deteriorated.

Figure 3A:
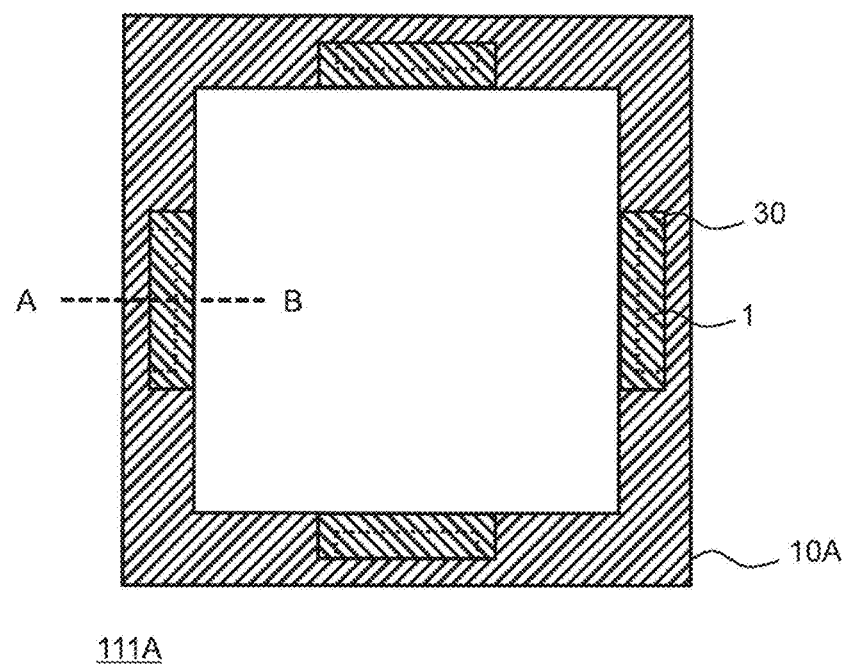
FIG. 3A is a schematic diagram of a support frame 111A according to an embodiment shows a top view.
Figure 3B:
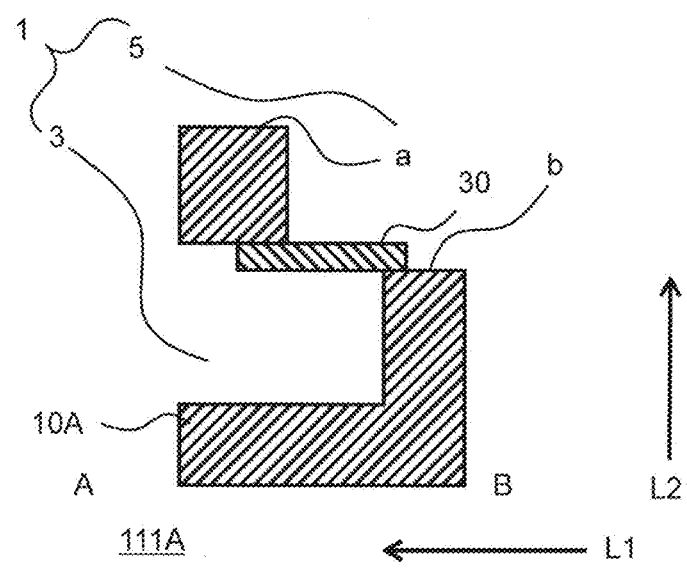
FIG. 3B shows a cross-sectional view of the AB-line in FIG. 3A.

Although the support frame 111 is shown as an example using the frame body 10 in which the hole 3 extending in the first direction L1 is an inner vent of the frame body 10 and the hole 5 extending in the second direction L2 intersecting the first direction L1 is an outer vent of the frame body 10, the support frame is not limited to this example. FIGS. 3A and 3B are schematic diagrams showing a support frame 111A according to an embodiment of the present invention. FIG. 3A is a top view of the support frame 111A in which the filter 30 is arranged in a frame body 10A, and FIG. 3B is a cross-sectional view of the support frame 111A at a position (line segment A B shown in FIG. 3A) in which the filter 30 is arranged. The frame body 10A has an outer vent of the frame body 10A in the hole 3 extending in the first direction L1 and an inner vent of the frame body 10A in the hole 5 extending in the direction L2 intersecting the first direction L1. In the frame body 10A, a surface b of the edge of the notched stepped structure is arranged on the inner edge of the frame body 10A (It is a side on which the pellicle film is extended and on which a closed space is formed when used as the pellicle. Thus, in the support frame 111A, the filter 30 is arranged at the end of the hole 5 located at the inner edge portion of the frame body 10A. The pellicle can be obtained by arranging the pellicle film or a pellicle film body, which will be described later, on the upper surface a of the support frame 111A. Thus, in an embodiment of the pellicle, the filter 30 is spaced from the pellicle film. The filter 30 is arranged below the pellicle film (the exposure master plate side) and spaced apart from the pellicle film, and the exposure light transmits the pellicle film, so that there is little exposure light to hit the filter. Therefore, the filter 30 is hardly deteriorated.

The support frame 111 and the support frame 111A are not limited to the structures such as the frame body 10 and the frame body 10A which are integrally formed. In an embodiment, a plurality of members (a plurality of plate-like layers) may be connected to provide the vent hole 1.

Embodiment 1

Figure 4A:
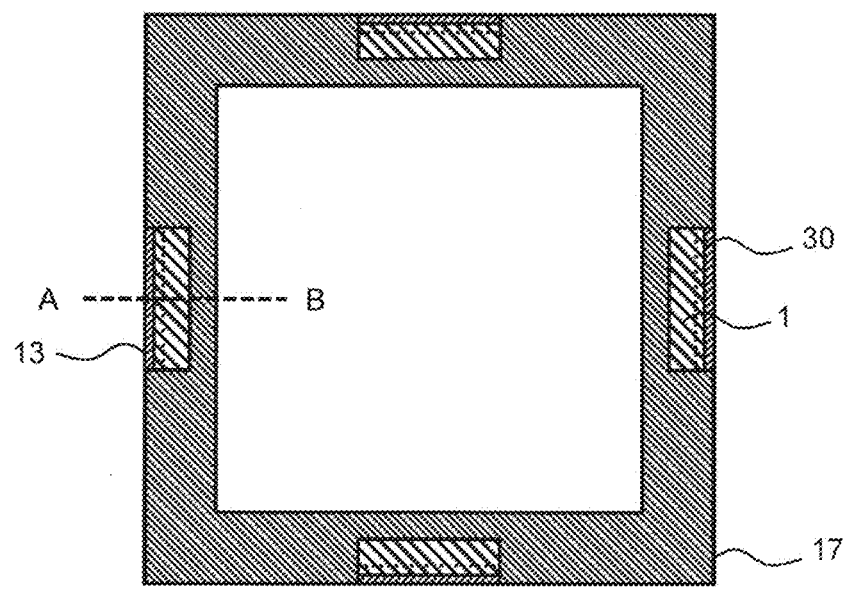
FIG. 4A is a schematic diagram of a support frame 111B according to Embodiment 1 shows a top view.
Figure 4B:
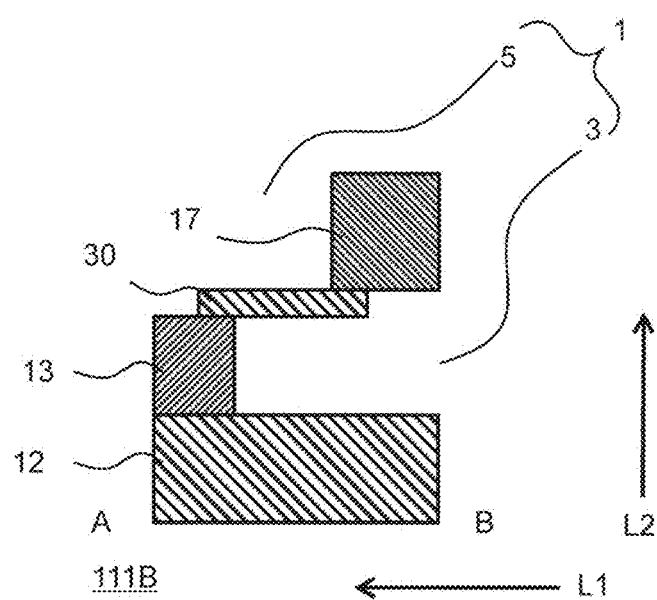
FIG. 4B shows a cross-sectional view of the AB-line in FIG. 4A.
Figure 5A:
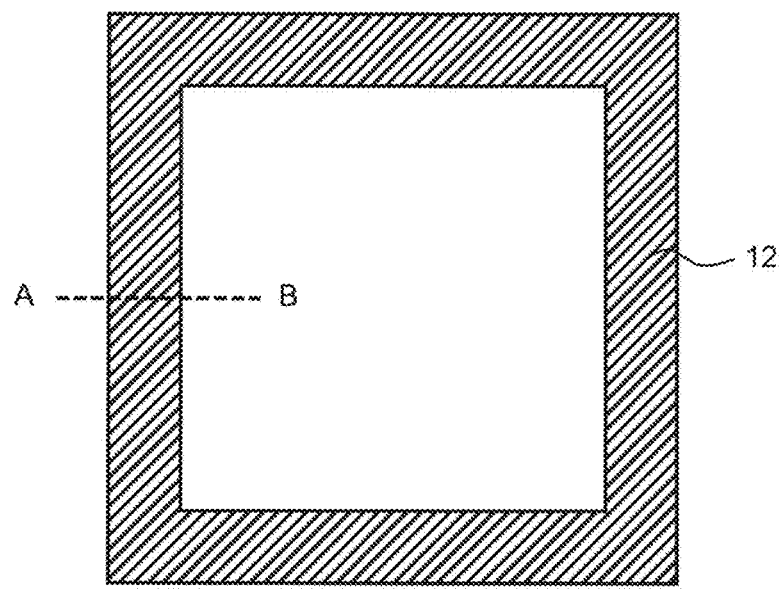
FIG. 5A is a schematic diagram for showing the configuration of a support frame 111B according to Embodiment 1, and in particular, is an explanatory diagram of bottom plate layer 12 and shows a top view.
Figure 5B:
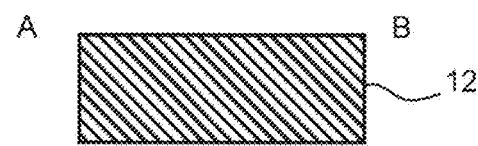
FIG. 5B shows a cross-sectional view of the AB-line in FIG. 5A.
Figure 6A:
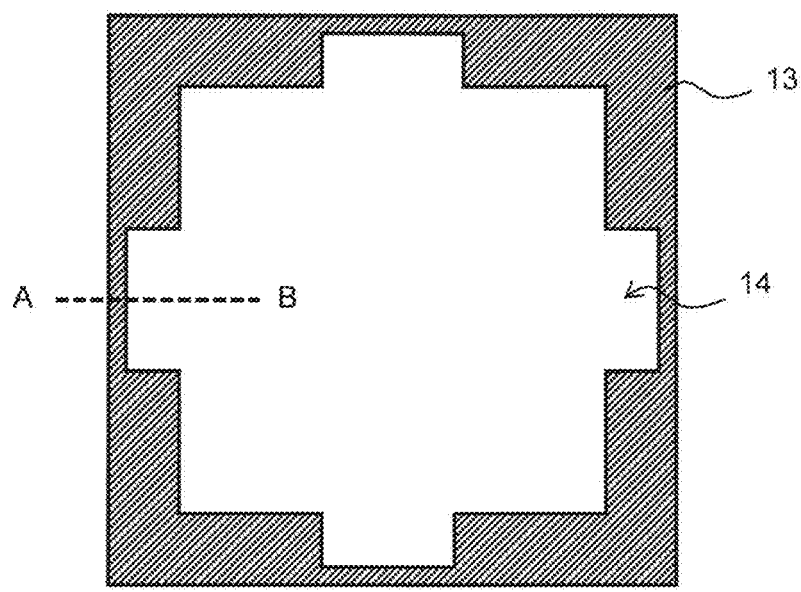
FIG. 6A is a schematic diagram for showing the configuration of a support frame 111B according to Embodiment 1, and in particular, is an explanatory diagram of an inner plate layer with vent hole 13 and shows a top view.
Figure 6B:
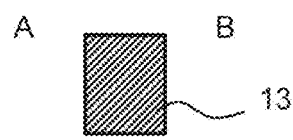
FIG. 6B shows a cross-sectional view of the AB-line in FIG. 6A.
Figure 7A:
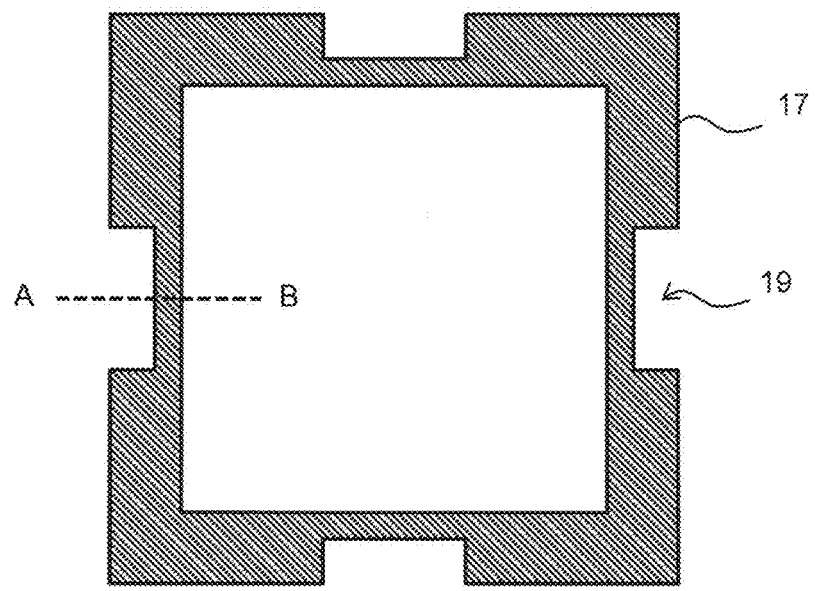
FIG. 7A is a schematic diagram for showing the configuration of a support frame 111B according to Embodiment 1, and in particular, is an explanatory diagram of an outer plate layer with vent hole 17 and shows a top view.
Figure 7B:
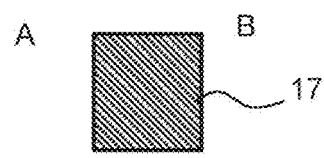
FIG. 7B shows a cross-sectional view of the AB-line in FIG. 7A.

FIGS. 4A and 4B are schematic diagrams showing a support frame 111B according to an embodiment of the present invention. FIG. 4A is a top view of the support frame 111B in which the filter 30 is arranged in the frame body, FIG. 4B is a cross-sectional view of the support frame 111B at the position where the filter 30 is arranged (line segment AB shown in FIG. 4A). In Embodiment 1, in order from the side (closed space side when the pellicle is connected to the master plate) connected to the master plate (a photomask), a bottom plate layer 12, an inner plate layer with vent hole 13 (a first thin plate), an outer plate layer with vent hole 17 (a second thin plate) are stacked to form the frame body. Each of these layers will be described. First, FIGS. 5A and 5B are explanatory views of a bottom plate layer 12, FIG. 5A is a top view of the bottom plate layer 12, FIG. 5B is a cross-sectional view of the bottom plate layer 12 at the line segment AB shown in FIG. 5A. FIGS. 6A and 6B are explanatory views of the inner plate layer with vent hole 13, FIG. 6A is a top view of the inner plate layer with vent hole 13, FIG. 6B is a cross-sectional view of the inner plate layer with vent hole 13 at the line segment AB shown in FIG. 6A. FIGS. 7A and 7B are explanatory views of the outer plate layer with vent hole 17, FIG. 7A is a top view of the outer plate layer with vent hole 17, FIG. 7B is a cross-sectional view of the outer plate layer with vent hole 17 at the line segment AB shown in FIG. 7A.

The bottom plate layer 12 shown in FIGS. 5A and 5B is, for example, a rectangular frame shape, but can be appropriately shaped according to the shape of the desired frame body. As the materials for the bottom plate layer 12 metals, glasses, silicon wafers, ceramics, and resins are exemplified. The bottom plate layer 12, the inner plate layer with vent hole 13, and the outer plate layer with vent hole 17, which will be described later, may be combined with a thin plate each formed of the same type of material, may be combined with a thin plate each formed of a different material, or may be combined with a thin plate formed of a partially shared material.

The inner plate layer with vent hole 13 shown in FIGS. 6A and 6B has, for example, a rectangular frame shape, and has a concave part (a concave shape) 14 which connects to an inner edge of the frame (It is a side on which pellicle film is extended and in which a closed space is formed when used as a pellicle) and extends to a first orientation. FIGS. 6A and 6B show an example in which one concave part 14 is arranged at one location for each side. However, the number of the concave part 14 is not particularly limited. The shape of the inner plate layer with vent hole 13 itself can also be appropriately configured according to the shape of the desired frame body. The size of the concave part 14 is preferably smaller than that of a concave part 19 in the outer plate layer with vent hole 17, which will be described later, from the viewpoint of durability. As the materials for the inner plate layer with vent hole 13, metals, glasses, silicon wafers, ceramics, and resins. The inner plate layer with vent hole 13 corresponds to the first thin plate.

The outer plate layer with vent hole 17 shown in FIGS. 7A and 7B has, for example, a rectangular frame shape, connected to the outer edge of the frame (It is a side opposed to the inside of the frame and does not form a closed space when used as the pellicle), and has a concave part (a concave shape) 19 recessed in the first direction. FIGS. 7A and 7B show an example in which one concave part 19 is arranged at each side. However, the number of the concave part 19 is not particularly limited. The shape of the outer plate layer with vent hole 17 itself can also be appropriately configured according to the shape of the desired frame body. As the materials for the outer plate layer with vent hole 17, metals, glasses, silicon wafers, ceramics, and resins are exemplified.

In this embodiment, an opening formed by the concave part 19 corresponds to a hole of the second direction L2. The outer plate layer with vent hole 17 corresponds to the second thin plate.

In the present embodiment, the fixing of the thin plate is not particularly limited as long as it is fixed. As the fixing method, for example, a tackiness sheet, an adhesive, a bonding agent, a normal temperature welding, a direct bonding, an atomic diffusion bonding, a metal bonding, a welding, a solder bonding, a thermocompression bonding, a hot melt, a flux bonding, a surface fastener, mechanical fixings such as a screw, pin, clip, crimping, and a method of fixing by pinching using magnetism and the like are exemplified.

The inner plate layer with vent hole 13 and the outer plate layer with vent hole 17 are sequentially stacked and fixed on the bottom plate layer 12, and covering at least a part of the concave part 14 with the bottom plate layer 12 and the outer plate layer with vent hole 17 to form the hole 3 extending in the first direction L1 opened at the inner edge of the frame body. Further, at least part of the concave part 14 of the inner plate layer with vent hole 13 and a concave part 19 of the outer plate layer with vent hole 17 are overlapped, so that the hole 5 connected to the hole 3 and extending in the second direction is formed. The vent hole 1 which is opened at the outer edge of the frame body is formed.

A support frame 111B is obtained by arranging the filter 30 at the end of the hole 5 of the frame body. In FIGS. 4A and 4B, the filter 30 can be in contact with the top surface of the inner plate layer with vent hole 13, that is, it can be connected to the openings formed by the concave part 19, but is not limited thereto. For the filter membrane filters such as HEPA and ULPA, a nonwoven fabric filter, a filter fiber stacking fibers such as carbon nanotubes and cellulose, a ceramic filter, a glass filter, a metal-sintered filter, a hollow fiber filter, and the like can be utilized. The support frame according to an embodiment of the present invention can reduce the time to vacuum because area of the vent can be made large even when the ventilation resistance of the filter is high, and is preferably a filter having the following characteristics: initial pressure loss of 100 Pa or more and 550 Pa or less; a particle capture rate of 99.7% or more and 100% or less with respect to a particle hiving a particle diameter of 0.15 μm or more and 0.3 μm or less. In addition, when a plurality of through hole is arranged and the filter is arranged in each of through hole, it is preferable that the total area of the plurality of the filters is 100 $mm^2$ to 2000 $mm^2$ or less. The fixing of the filter is not particularly limited as long as it is fixed. As the fixing method, for example, a method similar to the method of fixing the thin plate can be exemplified. The explanation of this filter is the same in the respective embodiments, and therefore, the explanation thereof will be omitted below.

The pellicle can be obtained by placing the pellicle film or the pellicle frame body on the upper surface of the outer plate layer with vent hole 17, which will be described later. Thus, in an embodiment of the pellicle, the filter 30 is spaced from the pellicle film. More specifically, the filter 30 is arranged below the pellicle film (master plate side). Therefore, the EUV light is hardly hit by the outer plate layer with vent hole 17, makes it possible to suppress the degradation of the filter 30. Further, in the support frame according to the embodiment of the present invention, the filter is detachably fixed to the frame body, as described above. Therefore, it is advantageous that after the pellicle using the support frame according to the embodiment of the present invention is removed from the exposure device, only the filter can be replaced, and the frame body can be reused. On the other hand, embedding the filter inside the frame body further reduces the filter degradation.

Modification of Embodiment 1

In Embodiment 1, the support frame 111B is exemplified by using the frame body in which the hole 3 extending in the first direction L1 is the inner edge vent of the frame body and the hole 5 extending in the second direction L2 intersecting with the first direction L1 is the outer edge vent of the frame body, but the support frame is not limited thereto. As described in the support frame 111A, the frame body can also be used in which the hole 3 extending in the first direction L1 is the outer edge vent of the frame body and the hole 5 extending in the second direction L2 intersecting the first direction L1 is the inner edge vent of the frame body.

Figure 8A:
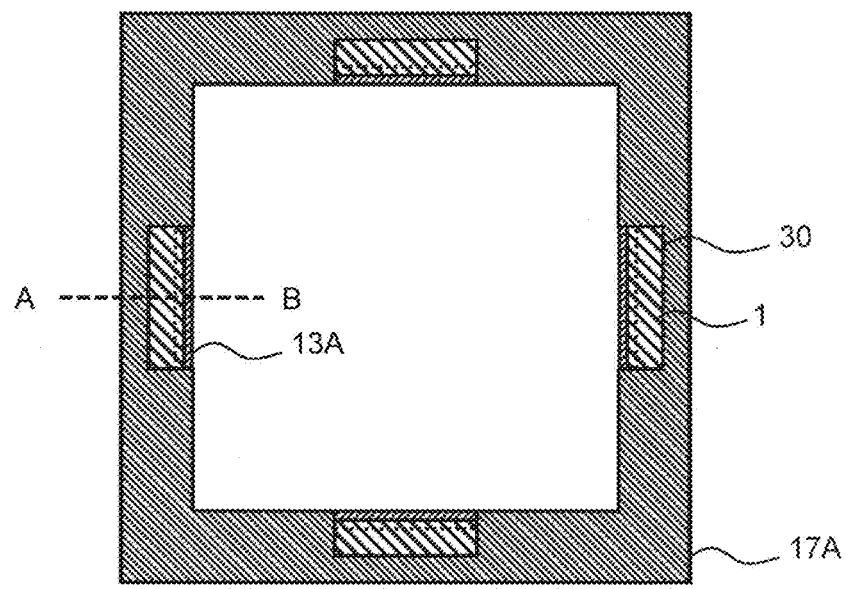
FIG. 8A is a schematic diagram of a support frame 111C according to a modification of Embodiment 1 and shows a top view.
Figure 8B:
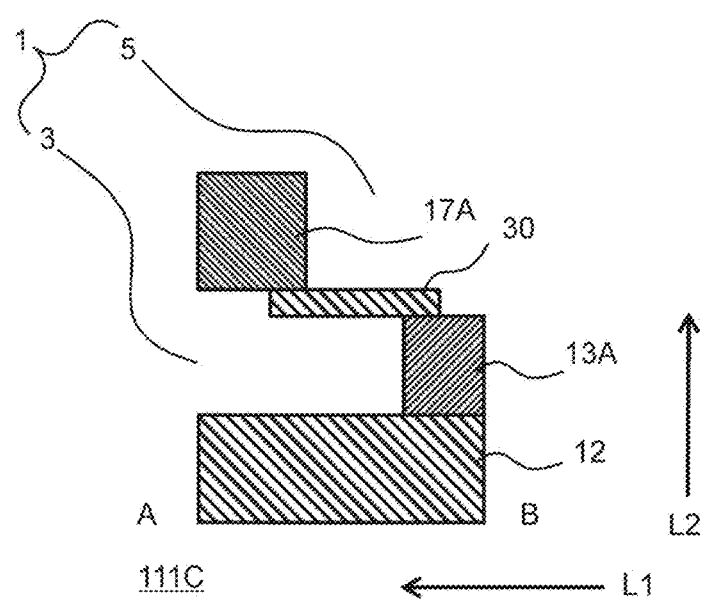
FIG. 8B shows a cross-sectional view of the AB-line in FIG. 8A.

FIGS. 8A and 8B are schematic diagrams showing a support frame 111C which is a modification of the Embodiment 1. FIG. 8A is a top view of the support frame 111C in which the filter 30 is arranged in the frame body, and FIG. 8B is a cross-sectional view of the support frame 111C at the position where the filter 30 is arranged (line segment AB shown in FIG. 8A). The modification of the embodiment 1 is to form the frame body by stacking the bottom plate layer 12, the outer plate layer with vent hole 13A (the second thin plate), the inner plate layer with vent hole 17A (the first thin plate) in order from the side connected to the master plate. Each of these layers will be described. Since the bottom plate layer 12 can use the same configuration as the above-described configuration, detailed descriptions thereof are omitted.

Figure 9A:
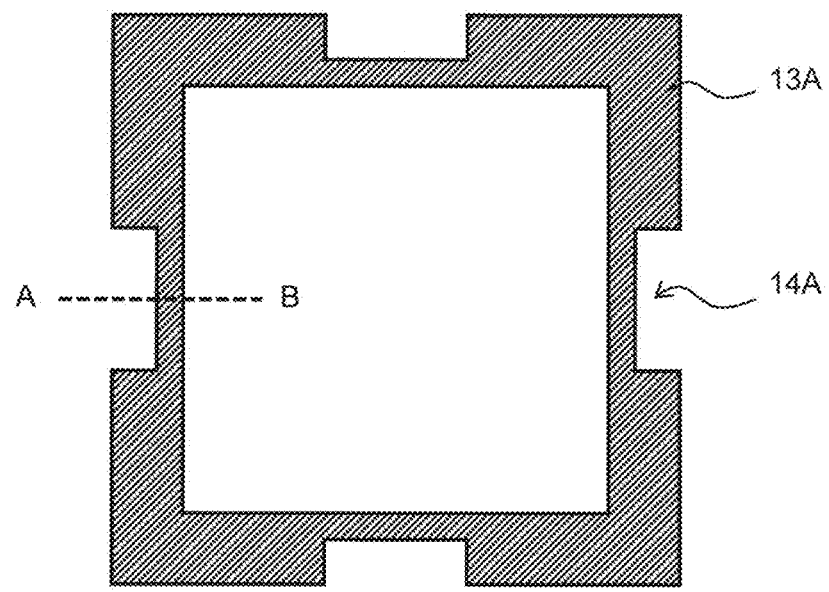
FIG. 9A is a schematic diagram for showing a configuration of a support frame 111B according to a modification of Embodiment 1, and in particular, is an explanatory diagram of an outer plate layer with vent hole 13A and shows a top view.
Figure 9B:
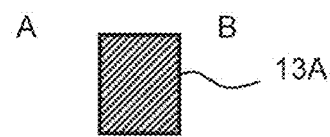
FIG. 9B shows a cross-sectional view of the AB-line in FIG. 9A.

FIGS. 9A and 9B is an explanatory view of the outer plate layer with vent hole 13A, FIG. 9A is a top view of the outer plate layer with vent hole 13A, FIG. 9B is a cross-sectional view of the outer plate layer with vent hole 13A at the line segment AB shown in FIG. 9A. The outer plate layer with vent hole 13A shown in FIGS. 9A and 9B has, for example, rectangular frame shape, and has a concave part (a concave shape) 14A which is connected to the outer edge of the frame and recessed in the first direction. The outer plate layer with vent hole 13A can have the same configuration as that of the outer plate layer with vent hole 17 described above, and therefore detailed descriptions thereof are omitted. In this modification, the opening formed by the concave part 14A corresponds to the hole of the first direction L1. In addition, the outer plate layer with vent hole 13A corresponds to the first thin plate.

Figure 10A:
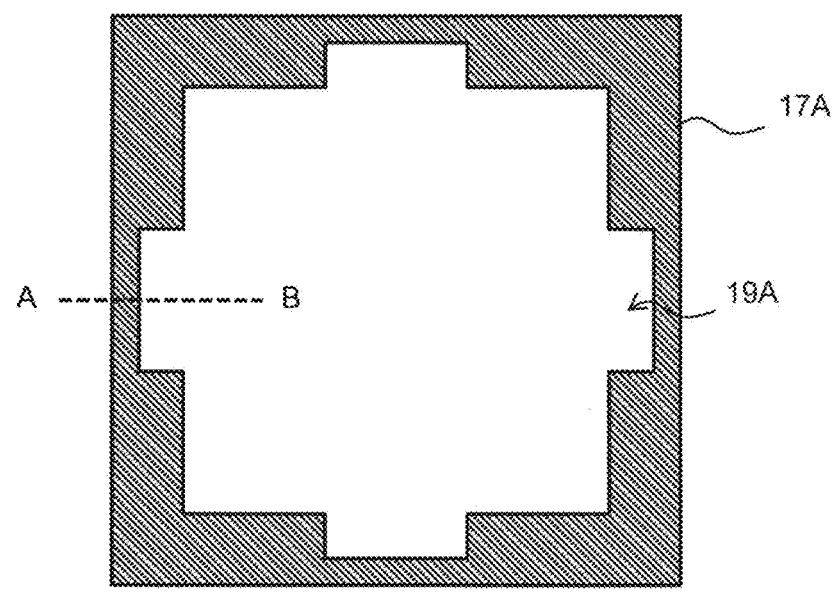
FIG. 10A is a schematic diagram for showing a configuration of a support frame 111B according to a modification of Embodiment 1, and is an explanatory diagram of an inner plate layer with vent hole 17A in particular and shows a top view.
Figure 10B:
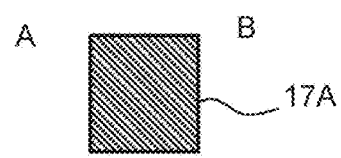
FIG. 10B shows a cross-sectional view of the AB-line in FIG. 10A.

FIGS. 10A and 10B are explanatory views of the inner plate layer with vent hole 17A, FIG. 10A is a top view of the inner plate layer with vent hole 17A, FIG. 10B is a cross-sectional view of the inner plate layer with vent hole 17A at the line segment AB shown in FIG. 7A. The inner plate layer with vent hole 17A shown in FIGS. 10A and 10B has, for example, rectangular frame shape and has a concave part (a concave shape) 19A which connects to the inner edge of the frame and extends in a first direction. The inner plate layer with vent hole 17A can use the same configuration as that of the inner plate layer with vent hole 13 described above, and therefore detailed descriptions thereof are omitted. In this modification, the opening formed by the concave part 19A corresponds to the hole of the second direction L2. The inner plate layer with vent hole 17A corresponds to the second thin plate.

The fixing of the thin plate may be fixed, and the configuration described in the Embodiment 1 is applicable; therefore, detailed descriptions thereof are omitted.

Thus, by stacking and fixing the outer plate layer with vent hole 13A and the inner plate layer with vent hole 17A sequentially on the bottom plate layer 12, and covering at least a part of the concave part 14A with the bottom plate layer 12 and the inner plate layer with vent hole 17A, the hole 3 extending in the first direction L1 opened to the outer side of the frame body is formed. Further, by superimposing at least a part of the concave part 14A of the outer plate layer with vent hole 13A and the concave part 19A of the inner plate layer with vent hole 17A, the hole 5 connected to the hole 3 and extending in the second direction is formed, and the vent hole 1 opened to the inside of frame body is formed.

The support frame 111C is obtained by arranging the filter 30 at the end of the hole 5 of the frame body. In FIGS. 8A and 8B, the filter 30 can be in contact with the upper surface of the outer plate layer with vent hole 13A, that is, can be contacted to the openings formed by the concave part 19A, but is not limited thereto. Since the explanation on the filter is described above, detailed explanation will be omitted.

The pellicle can be obtained by placing the pellicle film or the pellicle film body on the upper surface of the inner plate layer with vent hole 17A, which will be described later. Thus, in the pellicle according to the present modification, the filter 30 is arranged away from the pellicle film. More specifically, the filter 30 is arranged below of the pellicle film (master plate side). Therefore, the EUV light is transmitted through the pellicle film, so there is less EUV light hitting the filter. Therefore, degradation of the filter 30 can be suppressed. Further, in the support frame according to the present modification, as described above, the filter is detachably fixed to the frame body. Therefore, it is advantageous that after peeling off the pellicle using the support frame according to this modification from the exposure device, only the filter can be replaced to reuse the frame body. On the other hand, embedding filter inside the frame body further reduces the filter degradation.

Embodiment 2

Figure 11A:
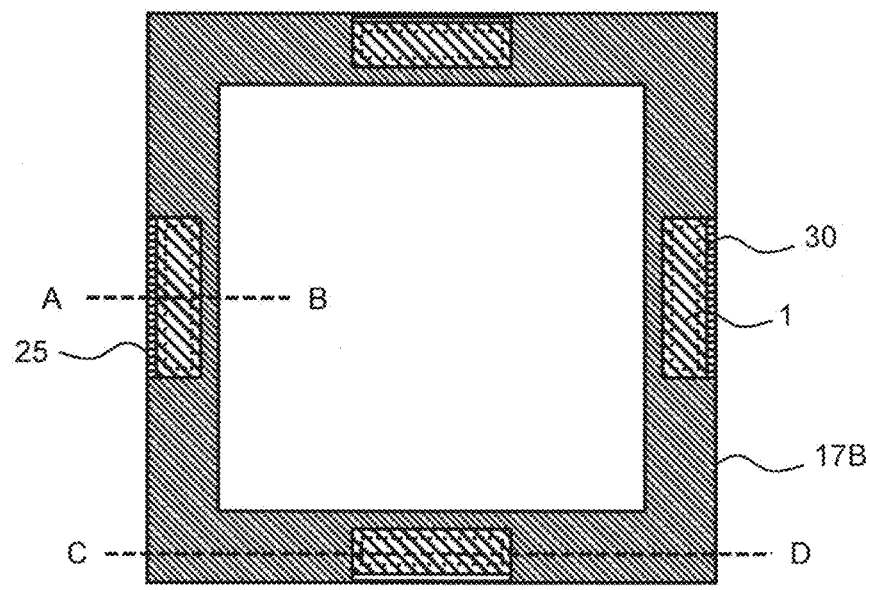
FIG. 11A is a schematic diagram showing a configuration of a support frame 111D according to Embodiment 2 shows a top view.
Figure 11B:
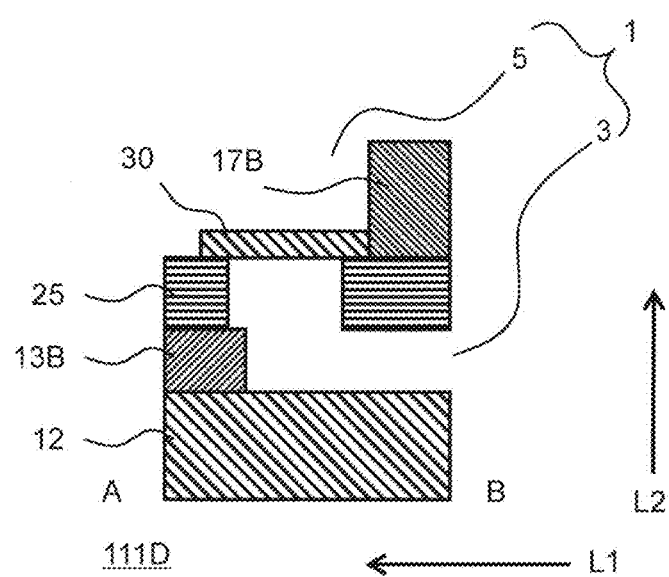
FIG. 11B shows a cross-sectional view of the AB-line in FIG. 11A.

FIGS. 11A and 11B are schematic diagrams showing a support frame 111D according to an embodiment of the present invention. FIG. 11A is a top view of the support frame 111D in which the filter 30 is arranged in the frame body, and FIG. 11B is a cross-sectional view of the support frame 111D at the position where the filter 30 is arranged (line segment AB shown in FIG. 11A). In Embodiment 2, in order from the side connected to the master plate, the bottom plate layer 12, the inner plate layer with vent hole 13B, the spacer layer with through hole 25, the outer plate layer with vent hole 17B are stacked to form the frame body. In the Embodiment 2, as shown in FIG. 11B, the bottom plate layer 12, the inner plate layer with vent hole 13B, the spacer layer with through hole 25, the outer plate layer with vent hole 17B can be connected so as to be stepped gradually outward (outer when connected to the exposure master plate as the pellicle)). The configurations of the bottom plate layer 12, the inner plate layer with vent hole 13B, and the outer plate layer with vent hole 17B are the same as those of the inner plate layer with vent hole 13 and the outer plate layer with vent hole 17 described in the Embodiment 1, and therefore detailed descriptions thereof are omitted. Further, the same configuration as the configuration described in the Embodiment 1 will not be described in detail.

Figure 12A:
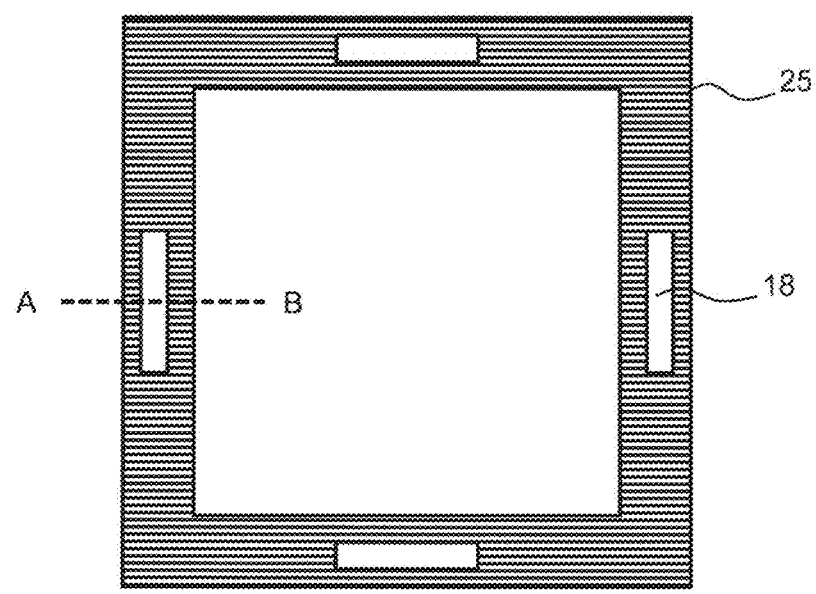
FIG. 12A is a schematic diagram for showing the configuration of a support frame 111D according to Embodiment 2, and in particular, is an explanatory diagram of a spacer layer 25 with through hole and shows a top view.
Figure 12B:
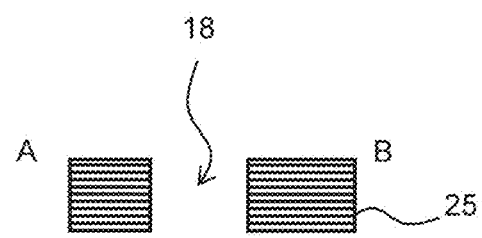
FIG. 12B shows a cross-sectional view of the AB-line in FIG. 12A.

FIGS. 12A and 12B are schematic diagrams showing a spacer layer with through hole 25 according to an embodiment of the present invention. FIG. 12A is a top view of the spacer layer with through hole 25, and FIG. 12B is a cross-sectional view of the spacer layer with through hole 25 in line segment AB. The spacer layer with through hole 25 is provided between the inner plate layer with vent hole 13B and the outer plate layer with vent hole 17B, and has a through hole 18 which penetrates a surface opposing the inner plate layer with vent hole 13B and a surface opposing the outer plate layer with vent hole 17B. The spacer layer with through hole 25 is stacked with the outer plate layer with vent hole 17B and, upon plane view from the outer plate layer with vent hole 17B side, the through hole 18 is preferably exposed without hiding by the outer plate layer with vent hole 17B. According to this configuration, when connecting the filter 30 in the Embodiment 2, it can be connected on the spacer layer with through hole 25. This enables the filter 30 to adhere its four sides to the spacer layer 25, and when the filter 30 is arranged, the frame body with less leakage can be obtained. In addition, connecting the filter 30 to the spacer layer with through hole 25 further facilitates attachment and detachment of the filter 30. In this embodiment, the hole 5 is composed of an opening formed by the outer plate layer with vent hole 17B and the spacer layer 25, the through hole 18 present in the spacer layer 25, and the inner plate layer with vent hole 13B.

In the support frame 111B described in the Embodiment 1, as shown in FIG. 4B, a part where the filter 30 and the inner plate layer with vent hole 13 is in contact and a part where the filter 30 and the outer plate layer with vent hole 17 are in contact need to be fixed, respectively. On the other hand, in the support frame 111D according to the Embodiment 2, by disposing the spacer layer 25 between the inner plate layer with vent hole 13 and the outer plate layer with vent hole 17, the filter 30 may be fixed only to the spacer layer 25, and the filter 30 can be easily fixed.

The pellicle can be obtained by placing the pellicle film or the pellicle film body on the upper surface of the outer plate layer with vent hole 17B, which will be described later. Thus, in the pellicle according to an embodiment of the present invention, the filter 30 is spaced from the pellicle film. More specifically, the filter 30 is arranged below the pellicle film (master plate). Therefore, for example, the EUV light is hardly hit by the outer plate layer with vent hole 17B, the degradation of the filter 30 can be suppressed. Further, in the support frame according to the embodiment of the present invention, the filter is detachably fixed to the frame body, as described above. Therefore, it is advantageous that after peeling off the pellicle using the support frame according to the embodiment of the present invention from the exposure device, only the filter can be replaced to reuse the frame body. On the other hand, embedding the filter inside the frame body further reduces the filter degradation.

Modification of Embodiment 2

In the Embodiment 2, the support frame 111D is shown as an example using the frame body in which the hole 3 extending in the first direction L1 is the inner edge vent of the frame body and the hole 5 extending in the second direction L2 intersecting with the first direction L1 is the outer edge vent of the frame body, but the support frame according to the present invention is not limited to this. As described in the support frame 111A, the frame body can also be used in which the hole 3 extending in the first direction L1 is the outer edge vent of the frame body and the hole 5 extending in the second direction L2 intersecting the first direction L1 is the inner edge vent of the frame body.

Figure 13A:
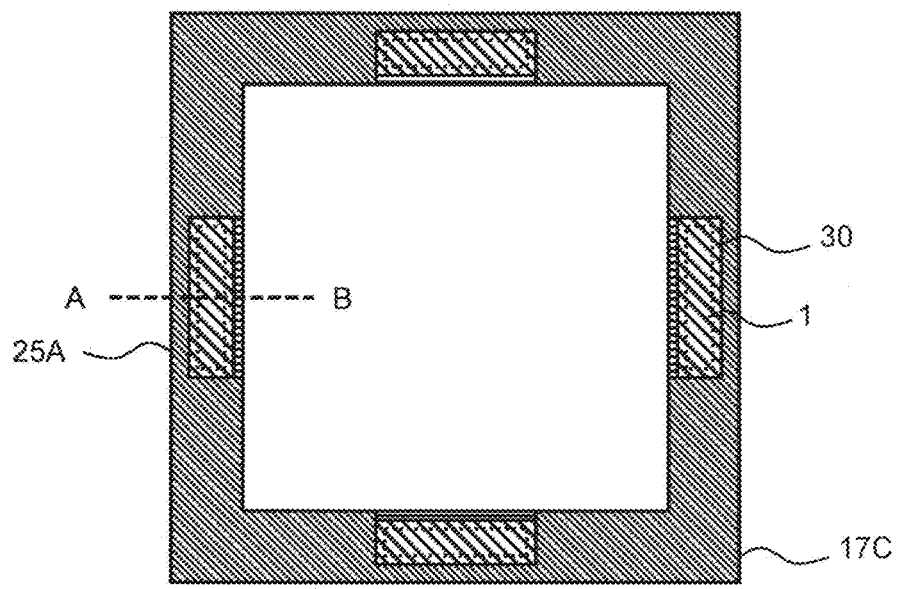
FIG. 13A is a schematic diagram of a support frame 111E according to a modification of Embodiment 2 and shows a top view.
Figure 13B:
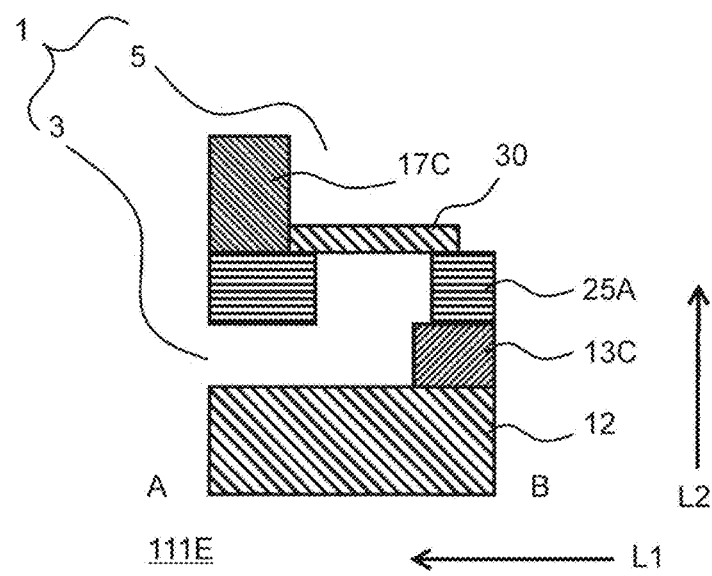
FIG. 13B shows a cross-sectional view of the AB-line in FIG. 13A.

FIGS. 13A and 13B are schematic diagrams showing a support frame 111E which is a modification of the Embodiment 2. FIG. 13A is a top view of the support frame 111E in which the filter 30 is arranged in the frame body, and FIG. 13B is a cross-sectional view of the support frame 111E at the position in which the filter 30 is arranged (line segment AB shown in FIG. 13A). A modification of the Embodiment 2 is to form the frame body by stacking the bottom plate layer 12, the outer plate layer with vent hole 13C, the spacer layer with through hole 25A, and the inner plate layer with vent hole 17C in order from the side connected to the master plate. In this modification, as shown in FIG. 13B, the bottom plate layer 12, the outer plate layer with vent hole 13C, the spacer layer with through hole 25A, and the inner plate layer with vent hole 17C can be connected so as to be stepped gradually outward. Since the configuration of the bottom plate layer 12, the outer plate layer with vent hole 13C and the inner plate layer with vent hole 17C can use the same configuration as the configuration of the outer plate layer with vent hole 13A and the inner plate layer with vent hole 17A described in the modification of the Embodiment 1, a detailed description thereof will be omitted. Further, the same configuration as the configuration described in the Embodiment 1 will not be described in detail.

Figure 14A:
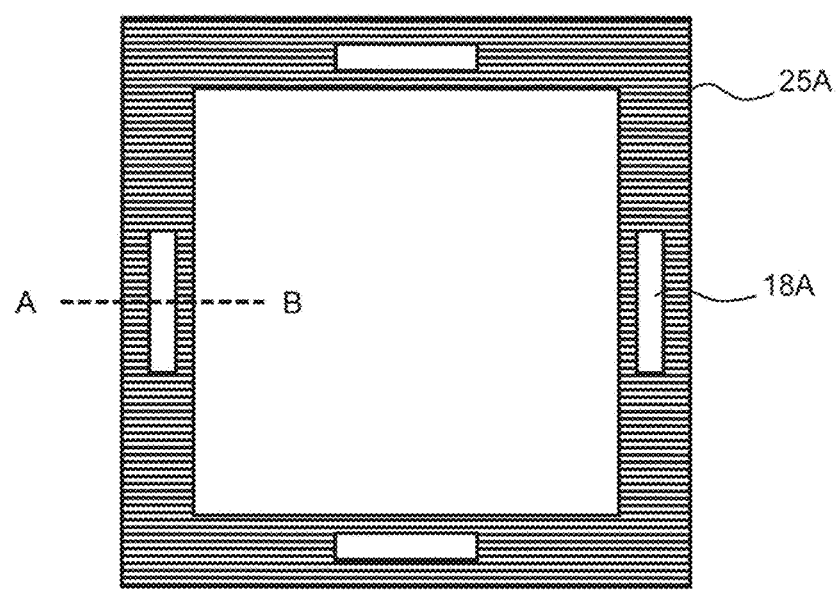
FIG. 14A is a schematic diagram for showing a configuration of a support frame 111E according to a modification of Embodiment 2, and in particular, is an explanatory diagram of a spacer layer 25A with through hole and shows a top view.
Figure 14B:
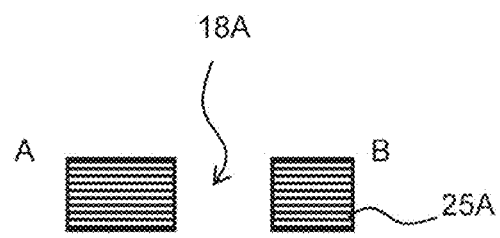
FIG. 14B shows a cross-sectional view of the AB-line in FIG. 14A.

FIGS. 14A and 14B are schematic diagrams showing a spacer layer 25A with through hole according to an embodiment of the present invention. FIG. 14A is a top view of the spacer layer with through hole 25A, and FIG. 14B is a cross-sectional view of the spacer layer with through hole 25A at segment AB. The spacer layer with through hole 25A is provided between the outer plate layer with vent hole 13C and the inner plate layer with vent hole 17C, and has a through hole 18A which penetrates a surface opposing the outer plate layer with vent hole 13C and a surface opposing the inner plate layer with vent hole 17C. The spacer layer with through hole 25A is stacked with the inner plate layer with vent hole 17C and, upon plane view from the inner plate layer with vent hole 17C side, through hole 18A is preferably exposed without hiding by the inner plate layer with vent hole 17C. According to this configuration, when the filter 30 is connected in the present modification, it can be connected on the spacer layer with through hole 25A. This enables the filter 30 to adhere its four sides to the spacer layer 25A, and when the filter 30 is arranged, the frame body with less leakage can be obtained. In addition, connecting the filter 30 to the spacer layer with through hole 25A further facilitates attachment and detachment of the filter 30. In this variant, hole 5 is composed of an opening formed by the inner plate layer with vent hole 17C and the spacer layer 25 and the through hole 18A present in the spacer layer 25A and an outer plate layer with vent hole 13C.

In the support frame 111C described in the modification of the Embodiment 1, as shown in FIG. 8B, a part where the filter 30 and the outer plate layer with vent hole 13A are in contact and a part where the filter 30 and the inner plate layer with vent hole 17A are in contact need to be fixed, respectively. On the other hand, in the support frame 111E according to the modification of the Embodiment 2, by disposing the spacer layer 25A between the outer plate layer with vent hole 13C and the inner plate layer with vent hole 17C, it is only necessary to fix the filter 30 to spacer layer 25, and it is possible to easily fix the filter 30.

The pellicle can be obtained by placing the pellicle film or the pellicle film body on the upper surface of the inner plate layer with vent hole 17C which will be described later. Therefore, in the pellicle according to the present modification, the filter 30 is arranged away from the pellicle film. More specifically, the filter 30 is arranged below the pellicle film (master plate). Therefore, the EUV light is transmitted through the pellicle film, so there is less EUV light hitting the filter. Therefore, degradation of the filter 30 can be suppressed. Further, in the support frame according to the present modification, as described above, the filter is detachably fixed to the frame body. Therefore, it is advantageous that after peeling off the pellicle using the support frame according to this modification from the exposure device, only the filter can be replaced to reuse the frame body. On the other hand, embedding the filter inside the frame body further reduces the filter degradation.

Embodiment 3

Figure 15A:
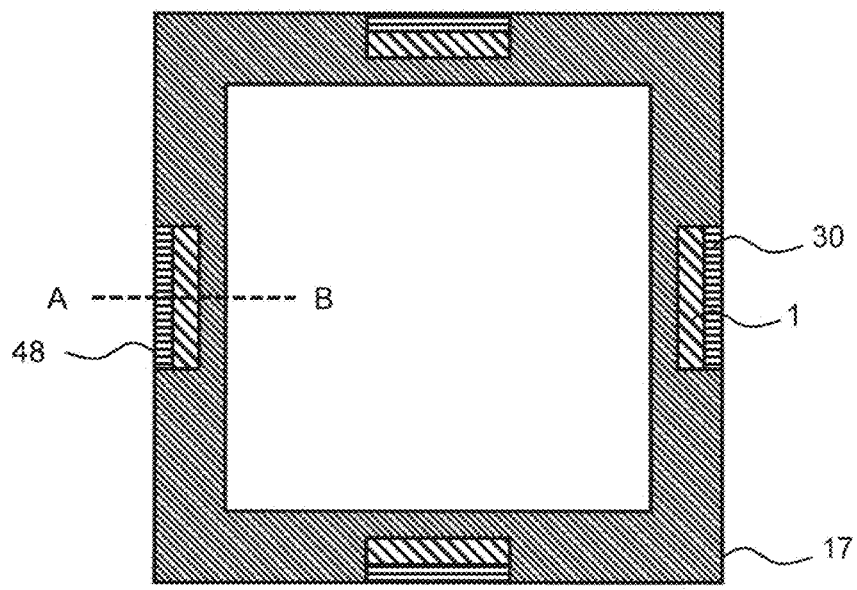
FIG. 15A is a schematic diagram of a support frame 111F according to Embodiment 3 and a top view and (b) is cross-sectional view of the AB-line in (a)
Figure 15B:
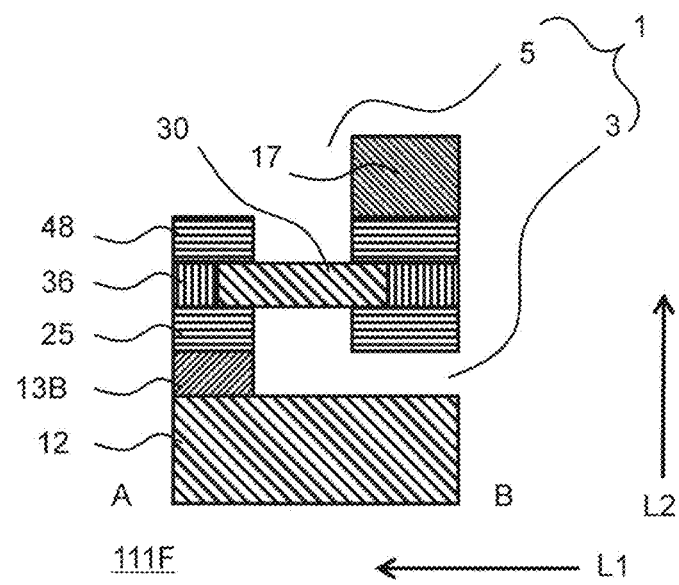
FIG. 15B is a cross-sectional view of the AB-line in FIG. 15A.

FIGS. 15A and 15B are schematic diagrams showing a support frame 111F according to an embodiment of the present invention. FIG. 15A is a top view of the support frame 111F in which the filter 30 is arranged in the frame body, and FIG. 15B is a cross-sectional view of the support frame 111F at the position where the filter 30 is arranged (line segment AB shown in FIG. 15A). In the Embodiment 3, the bottom plate layer 12, the inner plate layer with vent hole 13B, the spacer layer with through hole 25, a second spacer layer 36, a third spacer layer 48, and the outer plate layer with vent hole 17 are stacked in order from the side connected to the master plate to form the frame body. Since the configurations of the bottom plate layer 12, the inner plate layer with vent hole 13B, the spacer layer with through hole 25, and the outer plate layer with vent hole 17 can be the same as those of the above-described embodiment, detailed descriptions thereof are omitted.

Figure 16A:
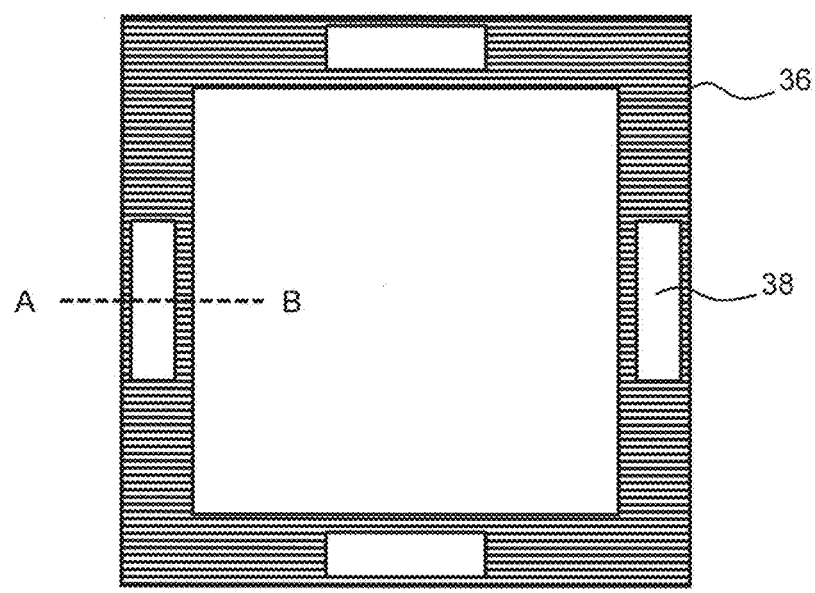
FIG. 16A is a schematic diagram for showing a configuration of a support frame 111F according to Embodiment 3, and in particular, is an explanatory diagram of a second spacer layer 36 and shows a top view.
Figure 16B:
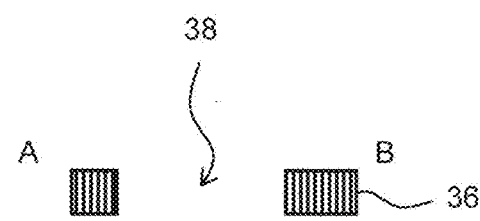
FIG. 16B shows a cross-sectional view of the AB-line in FIG. 16A.

FIGS. 16A and 16B are schematic diagrams showing a second spacer layer with through hole 36 according to an embodiment of the present invention. FIG. 16A is a top view of the second spacer layer 36, and FIG. 16B is a cross-sectional view of the second spacer layer 36 at the line segment AB. The second spacer layer 36 is arranged between the spacer layer with through hole 25 and a third spacer layer 48, which will be described later, and has a through hole 38. The through hole 38 of the second spacer layer 36 is wider in the first direction L1 than the through hole 18 of the spacer layer with through hole 25. As the materials for the second spacer layer 36, metals, glasses, silicon wafers, ceramics, and resins are exemplified.

The third spacer layer 48 is substantially identical in configuration to the spacer layer with through hole 25 and has the through hole 18. Since the third spacer layer 48 can use the same configuration as that of the spacer layer with through hole 25, detailed descriptions thereof are omitted.

In Embodiment 3, the position to connect the filter 30 would not be the inner plate layer with vent hole 13B, but would be the part between the spacer layer 25 and the third spacer layer 48, that means a position connected on the same plane surface as the second spacer layer 36. In the Embodiment 2, the hole 5 is composed of the outer plate layer with vent hole 17, and the through hole 18 present in the spacer layer with through hole 25, and the through hole 38 present in the second spacer layer 36, and the through hole 18 present in the third spacer layer 48.

The filter 30 may be bonded to the spacer layer with through hole 25 only on one side, and may be bonded to the third spacer layer 48 on the other side.

Since both sides of the filter 30 can be bonded to the spacer layer 25 and the third spacer layer with through hole 48, when the filter 30 is arranged, the leakage will be less in the support frame 111F.

Furthermore, if there is a slight distortion in any of the bottom plate layer 12, the inner plate layer with vent hole 13B, and the outer plate layer with vent hole 17, the distortion can be corrected by using a plurality of the spacer layer. For example, if any of the bottom plate layer 12, the inner plate layer with vent hole 13B, and the outer plate layer with vent hole 17 are distorted, the distortion can be corrected by combining the spacer layer with the distortion opposite to that distortion.

Modification of Embodiment 3

In the Embodiment 3, the support frame 111F is exemplified by using the frame body in which the hole 3 extending in the first direction L1 is the inner edge vent of the frame body and the hole 5 extending in the second direction L2 intersecting with the first direction L1 is the outer edge vent of the frame body, but the support frame is not limited thereto. As described in the support frame 111A, the frame body can also be used in which the hole 3 extending in the first direction L1 is the outer edge vent of the frame body and the hole 5 extending in the second direction L2 intersecting the first direction L1 is the inner edge vent of the frame body.

Figure 17A:
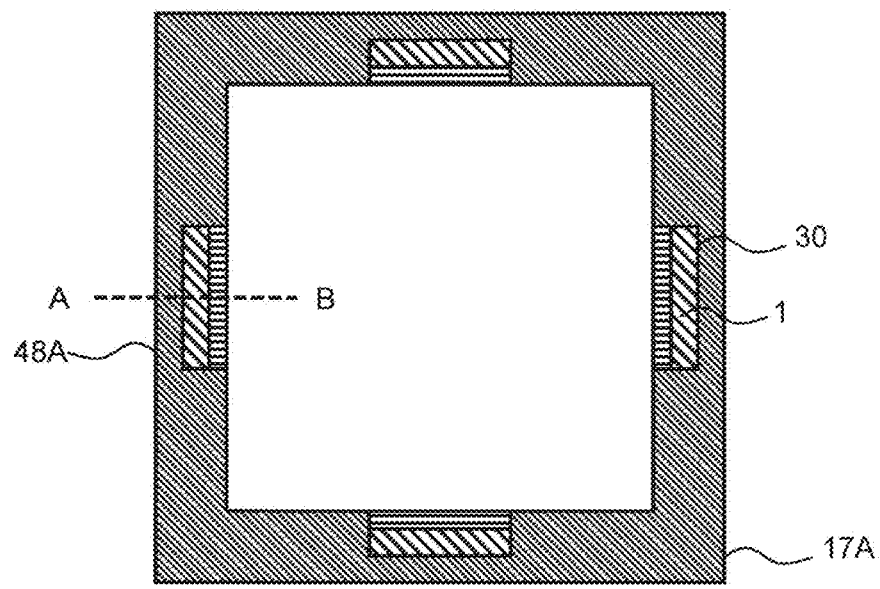
FIG. 17A is a schematic diagram of a support frame 111G according to a modification of Embodiment 3 and shows a top view.
Figure 17B:
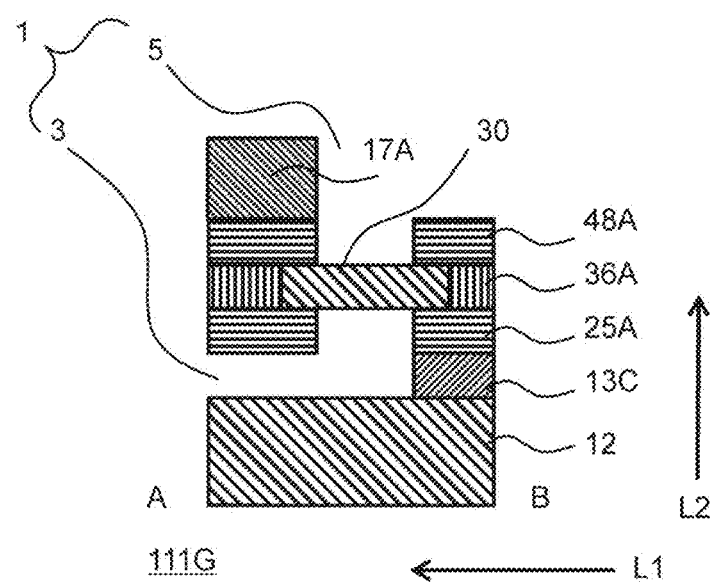
FIG. 17B shows a cross-sectional view of the AB-line in FIG. 17A.

FIGS. 17A and 17B are schematic diagrams showing a support frame 111G according to an embodiment of the present invention. FIG. 17A is a top view of the support frame 111G in which the filter 30 is arranged in the frame body, and FIG. 17B is a cross-sectional view of the support frame 111G at the position where the filter 30 is arranged (line segment A B shown in FIG. 17A). In the modification of the Embodiment 3, the bottom plate layer 12, the outer plate layer with vent hole 13C, the spacer layer with through hole 25A, the second spacer layer 36A, the third spacer layer 48A, and the inner plate layer with vent hole 17A are stacked in order from the side connected to the master plate to form the frame body. Since the configurations of the bottom plate layer 12, the outer plate layer with vent hole 13C, the spacer layer with through hole 25A, and the inner plate layer with vent hole 17A can be the same as those of the above-described embodiment, detailed descriptions thereof are omitted.

Figure 18A:
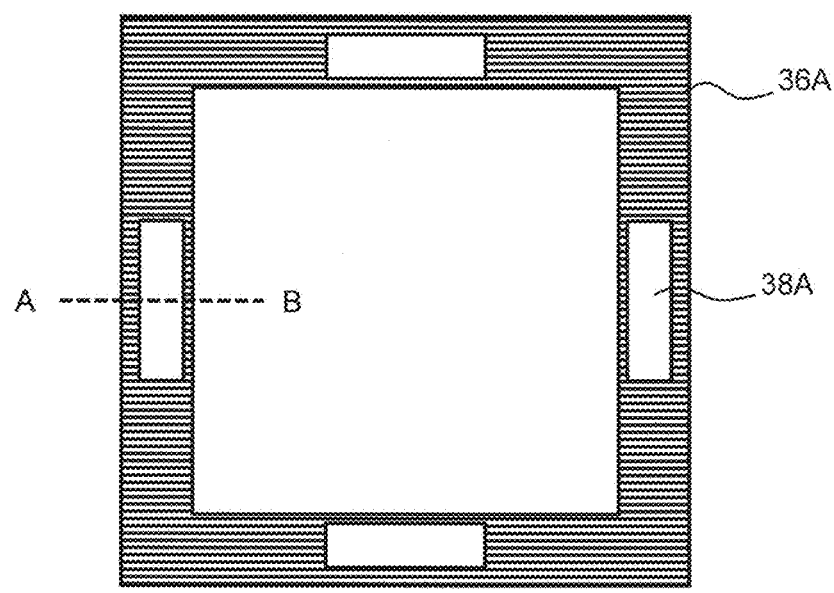
FIG. 18A is a schematic diagram for showing a configuration of a support frame 111G according to a modification of Embodiment 1, and in particular, is an explanatory diagram of a second spacer layer 36A and shows a top view.
Figure 18B:
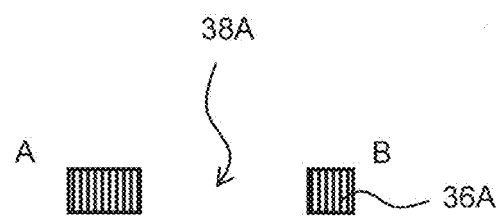
FIG. 18B shows a cross-sectional view of the AB-line in FIG. 18A.

FIGS. 18A and 18B are schematic diagrams showing a second spacer layer 36A according to an embodiment of the present invention. FIG. 18A is a top view of the second spacer layer 36A, and FIG. 18B is a cross-sectional view of the second spacer layer 36A at the line segment AB. The second spacer layer 36A is arranged between the spacer layer with through hole 25A and a third spacer layer 48A, which will be described later, and has a through hole 38A. The through hole 38A of the second spacer layer 36A is wider in the first direction L1 than the through hole 18A of the spacer layer with through hole 25A. As the materials for the second spacer layer 36A metals, glasses, silicon wafers, ceramics, and resins are exemplified.

The third spacer layer 48A is substantially identical in configuration to the spacer layer with through hole 25A and has the through hole 18A. Since the third spacer layer 48A can use the same configuration as the spacer layer with through hole 25A, detailed descriptions thereof are omitted.

In this modification, the position to connect the filter 30 is not the outer plate layer with vent hole 13C, but the part between the spacer layer with through hole 25A and the third spacer layer 48A, that means a position connected on the same plane surface as the second spacer layer 36A. In this modification, the hole 5 is composed of the inner plate layer with vent hole 17A, the through hole 18A present in the spacer layer with through hole 25A, the through hole 38A present in the second spacer layer 36A, and the through hole 18A present in the third spacer layer 48A.

The filter 30 may be bonded to the spacer layer with through hole 25A only on one side, and may be bonded to the third spacer layer 48 on the other side.

Since both sides of the filter 30 can be bonded to the spacer layer with through hole 25A and the third spacer layer 48A, when the filter 30 is arranged, the leakage will be less in the support frame 111G.

Furthermore, if there is a slight distortion in any of the bottom plate layer 12, the inner plate layer with vent hole 13B, and the outer plate layer with vent hole 17, the distortion can be corrected by using a plurality of the spacer layer. For example, if any of the bottom plate layer 12, the outer plate layer with vent hole 13C, and the inner plate layer with vent hole 17A are distorted, the distortion can be corrected by combining the spacer layer with the distortion opposite to that distortion.

Embodiment 4

Figure 19A:
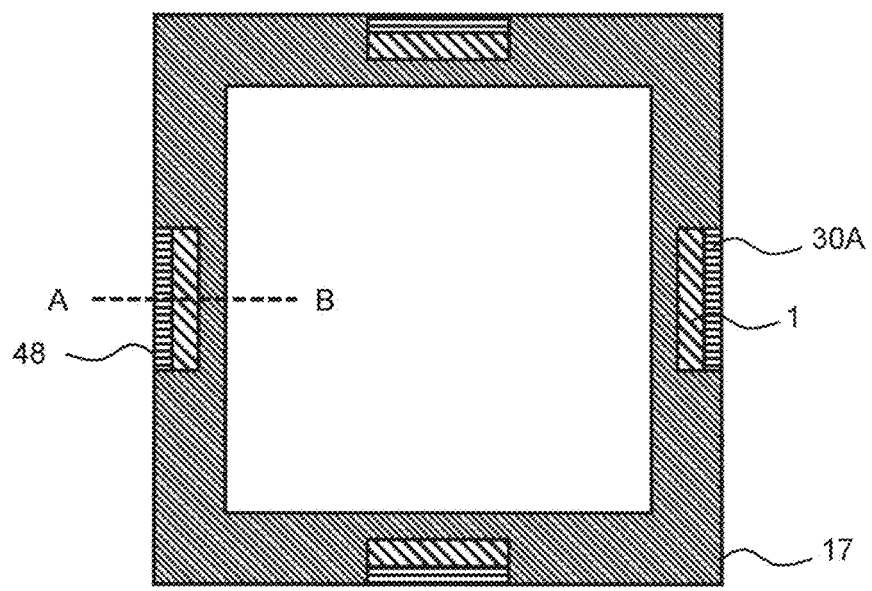
FIG. 19A is a schematic diagram of a support frame 111H according to Embodiment 4 and shows a top view.
Figure 19B:
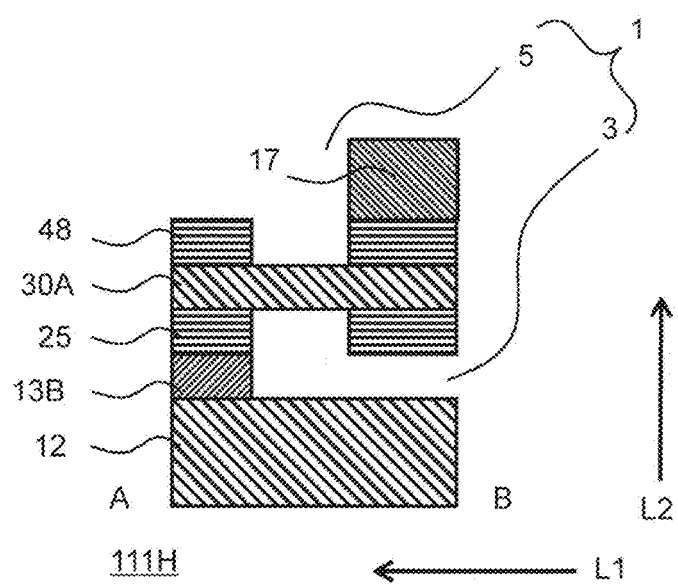
FIG. 19B shows a cross-sectional view of the AB-line in FIG. 19A.

FIGS. 19A and 19B are schematic diagrams showing a support frame 111H according to an embodiment of the present invention. FIG. 19A is a top view of the support frame 111H in which the filter 30 is arranged in the frame body, and FIG. 19B is a cross-sectional view of the support frame 111H at a position where the filter 30 is arranged (line segment A B shown in FIG. 19A). In the Embodiment 4, the bottom plate layer 12, the inner plate layer with vent hole 13B, the spacer layer with through hole 25, the filter 30A, the second spacer layer 48, and the outer plate layer with vent hole 17 are stacked in order from the side connected to the master plate to form the support frame 111H. Since the configurations of the bottom plate layer 12, the inner plate layer with vent hole 13B, the spacer layer with through hole 25, and the outer plate layer with vent hole 17 can be the same as those of the above-described embodiment, detailed descriptions thereof are omitted. Since the second spacer layer 48 can use the same configuration as that of the third spacer layer 48 described in the Embodiment 3, detailed descriptions thereof are omitted.

The filter 30A according to an embodiment of the present invention is provided inside the vent hole 1. The filter 30A, unlike the filter 30 described above, has a substantially rectangular frame shape geometry that is substantially the same as the bottom plate layer 12. The filter 30A is located between the spacer layer with through hole 25 and the second spacer layer 48 and connects to the spacer layer with through hole 25 in parts other than the through hole 18 located in the spacer layer with through hole 25. Therefore, in the support frame 111H, the filter 30A has a large area of contacting the spacer layer with through hole 25 and the second spacer layer 48, and can improve the reliability when the spacer layer with through hole 25 and the second spacer layer 48 are bonded. Further, since the filter 30A is a substantially rectangular-shaped sheet member, as compared with the filter 30 arranged for each hole 5, it is easy to arrange and replace.

As described in the above-mentioned respective modified examples, the support frame 111H according to the embodiment of the present invention is exemplified by using the frame body in which the hole 3 extending in the first direction L1 is the inner edge vent hole of the frame body and the hole 5 extending in the second direction L2 intersecting with the first direction L1 is the outer edge vent hole of the frame body, but the support frame according to the present invention is not limited thereto. As described in the support frame 111 A, the frame body can also be used in which the hole 3 extending in the first direction L1 is the outer edge vent of the frame body and the hole 5 extending in the second direction L2 intersecting the first direction L1 is the inner edge vent of the frame body. In this case, the filter 30A can be used to configure the support frame.

Embodiment 5

Figure 20A:
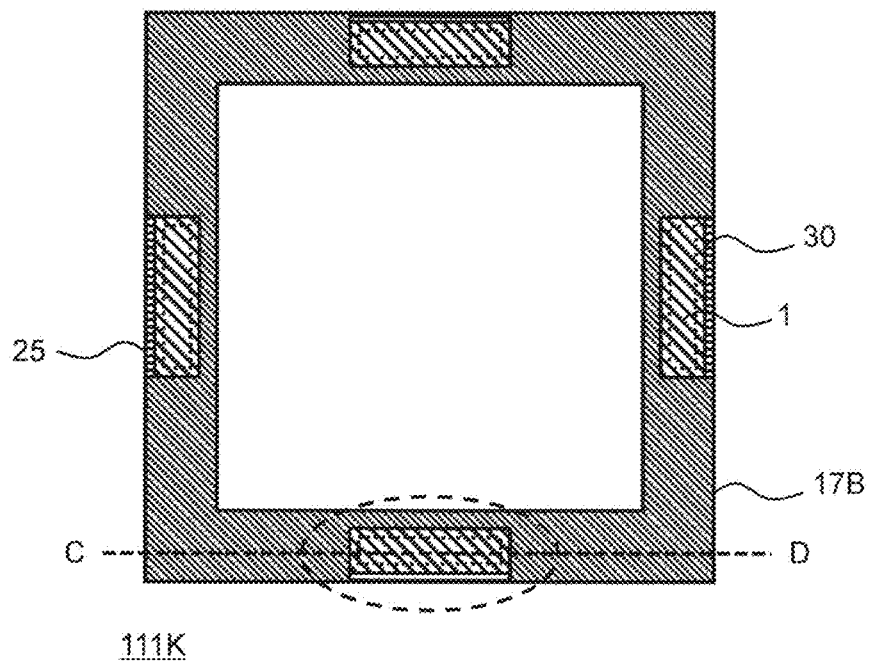
FIG. 20A is a schematic diagram showing a support frame 111K according to Embodiment 5 and shows a top view of a support frame 111K with a filter 30 placed in a frame body.
Figure 20B:
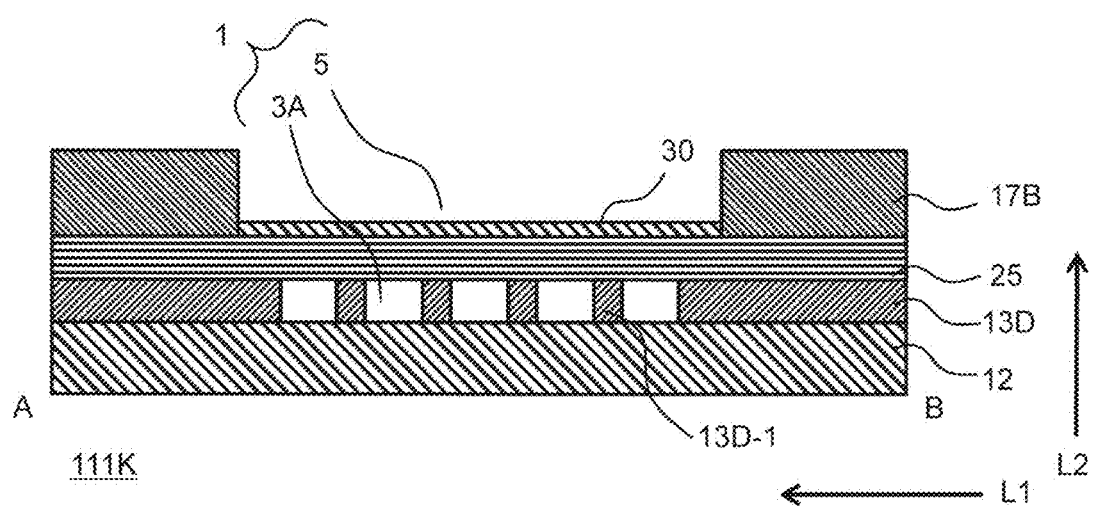
FIG. 20B shows a cross-sectional view of the support frame 111K at the position where the filter 30 is arranged (line segment CD shown in FIG. 20A)

Embodiment 5 will be described as a modification of the Embodiment 2. FIGS. 20A and 20B are schematic diagrams showing a support frame 111K according to an embodiment of the present invention. FIG. 20A is a top view of the support frame 111K in which the filter 30 is arranged in the frame body, and FIG. 20B is a cross-sectional view of the support frame 111K at the position where the filter 30 is arranged (line segment CD shown in FIG. 20A). In the Embodiment 5, in order from the side connected to the master plate, the bottom plate layer 12, the inner plate layer with vent hole 13D, the spacer layer with through hole 25, the outer plate layer with vent hole 17B are stacked to form the frame body. The configurations of the bottom plate layer 12, the spacer layer with through hole 25, the outer plate layer with vent hole 17B, and the filter 30 can be the same as those of the above-described embodiment, and therefore detailed descriptions thereof are omitted.

Figure 21A:
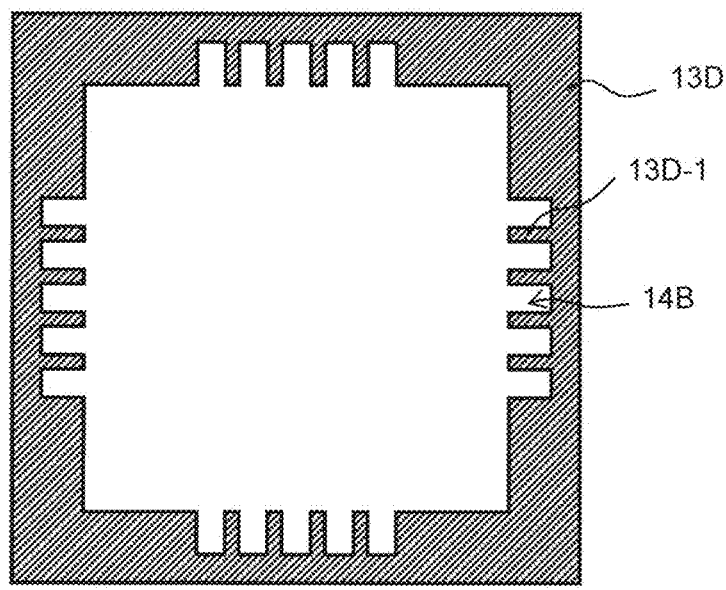
FIG. 21A is a top view indicating an inner plate layer with vent hole 13D according to Embodiment 5.
Figure 21B:
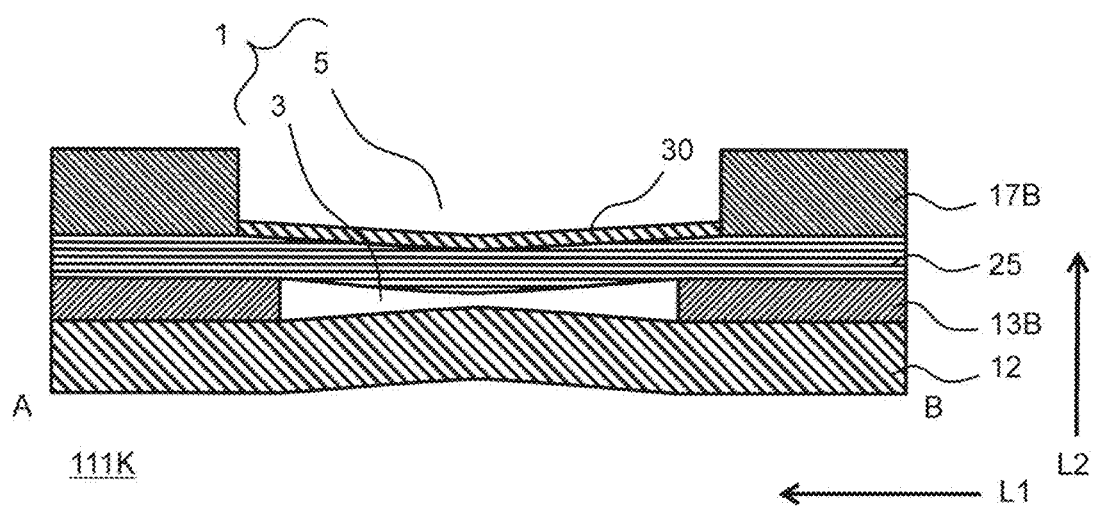
FIG. 21B is a schematic diagram illustrating the distortion of a support frame 111D at a position corresponding to the position where (a) a filter 30 is placed (line segment CD shown in FIG. 21A.

FIG. 21A is a top view showing an inner plate layer with vent hole 13D according to an embodiment of the present invention, and FIG. 21B is a schematic diagram illustrating distortion of a support frame 111D at a position corresponding to a position where the filter 30 is arranged (line segment CD shown in FIG. 11A). Note that FIG. 21B is a schematic diagram emphasizing distortion in order to compare with the present embodiment, and is not intended to necessarily include such distortion in the support frame 111D of the second embodiment.

In FIG. 21B, increasing the opening width of the hole 3, i.e., increasing the width in the longitudinal direction (direction L1 in FIG. 21B) of the concave part 14 of the inner plate layer with vent hole 13B, in the position of the hole 3, the bottom plate layer 12 and the spacer layer 25 and the filter 30 may also be distorted toward the hole 3. In order to suppress distortion of the bottom plate layer 12, the spacer layer 25, and the filter 30 toward the hole 3, in the present embodiment, the bottom plate layer 12 and the spacer layer 25 are supported by disposing comb-shaped structure 13 D-1 on the inner plate layer with vent hole 13D as shown in FIG. 21A. Therefore, in the present embodiment, the plurality of the holes 3A defined by the plurality of the concave parts 14B, the bottom plate layer 12, and the spacer layer 25 are configured, whereby the opening width per hole 3A is reduced, whereby the distortion of the bottom plate layer 12, the spacer layer 25, and the filter 30 can be suppressed, and a satisfactory opening area of the plurality of the holes 3A as a whole can be ensured.

The pellicle can be obtained by placing the pellicle film or the pellicle film body, on the upper surface of the outer plate layer with vent hole 17B which will be described later. Thus, in the pellicle of the embodiment of the present application, the filter 30 is spaced from the pellicle film. More specifically, the filter 30 is arranged below the pellicle film (master plate). Therefore, for example, EUV light is hardly hit by the outer plate layer with vent hole 17B, the degradation of the filter 30 can be suppressed. Further, in the support frame according to the embodiment of the present invention, the filter is detachably fixed to the frame body, as described above. Therefore, it is advantageous that after peeling off the pellicle using the support frame according to an embodiment of the present invention from the exposure device, only the filter can be replaced to reuse the frame body. On the other hand, embedding the filter inside the frame body further reduces the filter degradation.

Modification of Embodiment 5

In the Embodiment 5, the support frame 111K is exemplified by using the frame body in which the hole 3 extending in the first direction L1 is the inner edge vent of the frame body and the hole 5 extending in the second direction L2 intersecting with the first direction L1 is the outer edge vent of the frame body, but the support frame according to the present invention is not limited thereto. As described in the support frame 111 A, the frame body can also be used in which the hole 3 extending in the first direction L1 is the outer edge vent of the frame body and the hole 5 extending in the second direction L2 intersecting the first direction L1 is the inner edge vent of the frame body.

Figure 22A:
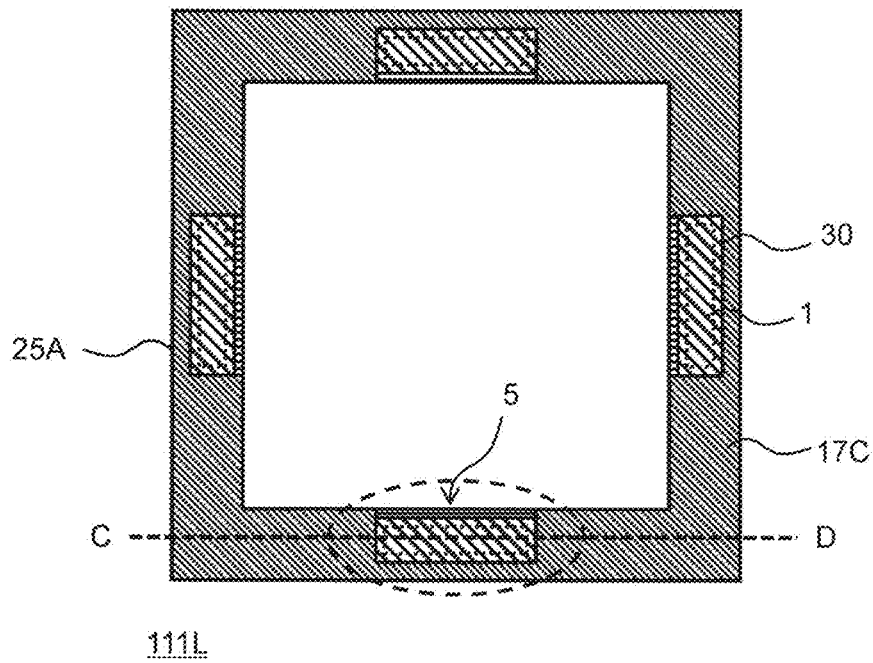
FIG. 22A is a schematic diagram showing a support frame 111L which is a modification of Embodiment 5 and shows a top view of a support frame 111L in which a filter 30 is arranged in a frame body.
Figure 22B:
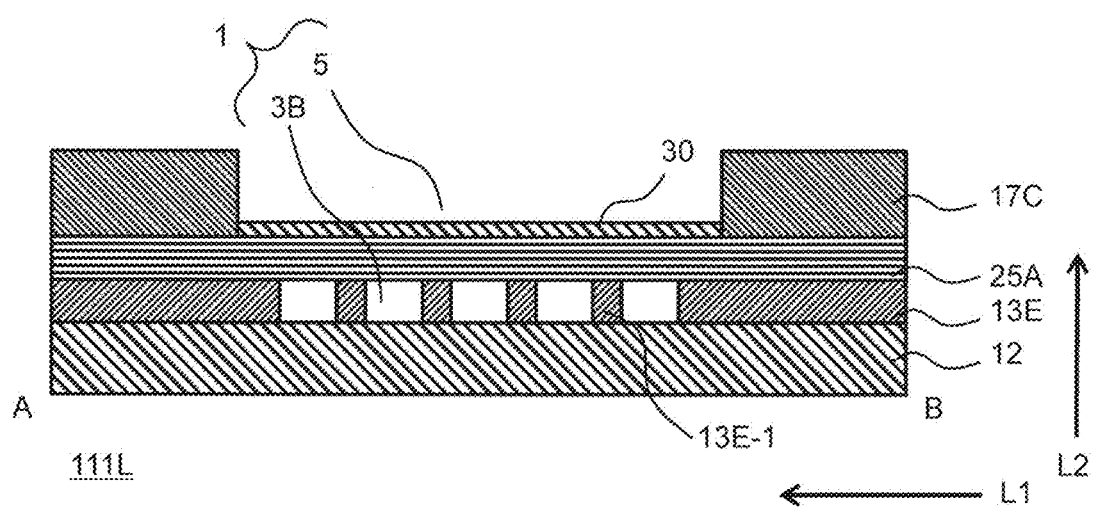
FIG. 22B shows a cross-sectional view of the support frame 111L at the position where the filter 30 is arranged (line segment CD shown in FIG. 22A).

FIGS. 22A and 22B are schematic diagrams showing a support frame 111L which is a modification of the Embodiment 5. FIG. 22A is a top view of the support frame 111L in which the filter 30 is arranged in the frame body, and FIG. 22B is a cross-sectional view of the support frame 111L at a position where the filter 30 is arranged (line segment CD shown in FIG. 22A). The modification of the Embodiment 5 is to form the frame body by stacking the bottom plate layer 12, the outer plate layer with vent hole 13E, the spacer layer with through hole 25A, and the inner plate layer with vent hole 17C in order from the side connected to the master plate. The configurations of the bottom plate layer 12, the spacer layer with through hole 25A, the inner plate layer with vent hole 17C, and the filter 30 can be the same as those of the above-described embodiment, and therefore detailed descriptions thereof are omitted.

Figure 23:
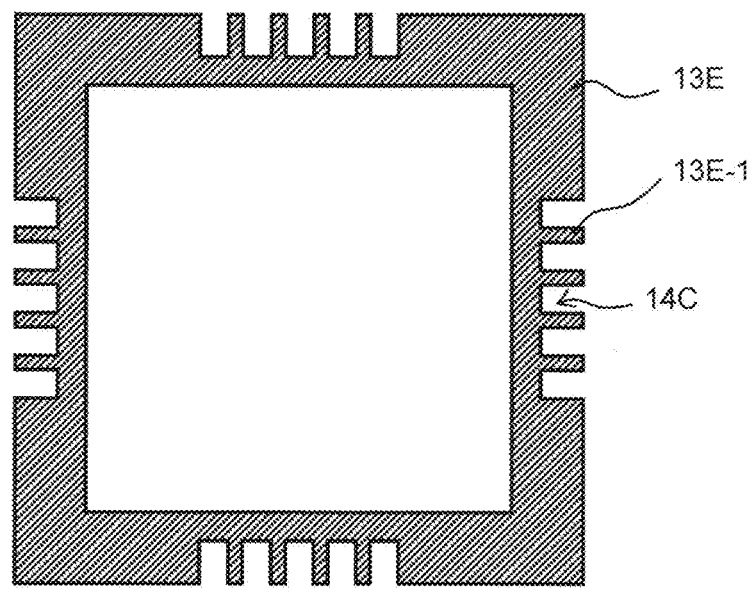
FIG. 23 is a top view showing an outer plate layer with vent hole 13E according to a variation of Embodiment 5.

FIG. 23 is a top view showing an outer plate layer with vent hole 13E according to an embodiment of the present invention. In this embodiment, the bottom plate layer 12 and the spacer layer 25A are supported by arranging comb-shaped structure 13E-1 on the outer plate layer with vent hole 13E as shown in FIG. 23. Therefore, in the present embodiment, the plurality of the holes 3B defined by the plurality of the concave parts 14C, the bottom plate layer 12, and the spacer layer 25A are configured, whereby the opening width per hole 3B is reduced, whereby the distortion of the bottom plate layer 12, the spacer layer 25A, and the filter 30 is suppressed, and a satisfactory opening area of the plurality of hole 3B as a whole can be ensured.

The pellicle can be obtained by placing the pellicle film or the pellicle film body, on the upper surface of the inner plate layer with vent hole 17C, which will be described later. Thus, in the embodiment of the pellicle, the filter 30 is spaced from the pellicle film. More specifically, the filter 30 is arranged below the pellicle film (master plate side). Therefore, for example, EUV light is hardly hit by the inner plate layer with vent hole 17C, thereby the degradation of the filter 30 can be suppressed. Further, in the support frame according to the embodiment of the present invention, the filter is detachably fixed to the frame body, as described above. Therefore, it is advantageous that after peeling off the pellicle using the support frame according to the embodiment of the present invention from the exposure device, only the filter can be replaced to reuse the frame body. On the other hand, embedding the filter inside the frame body further reduces the filter degradation.

Embodiment 6

Figure 24A:
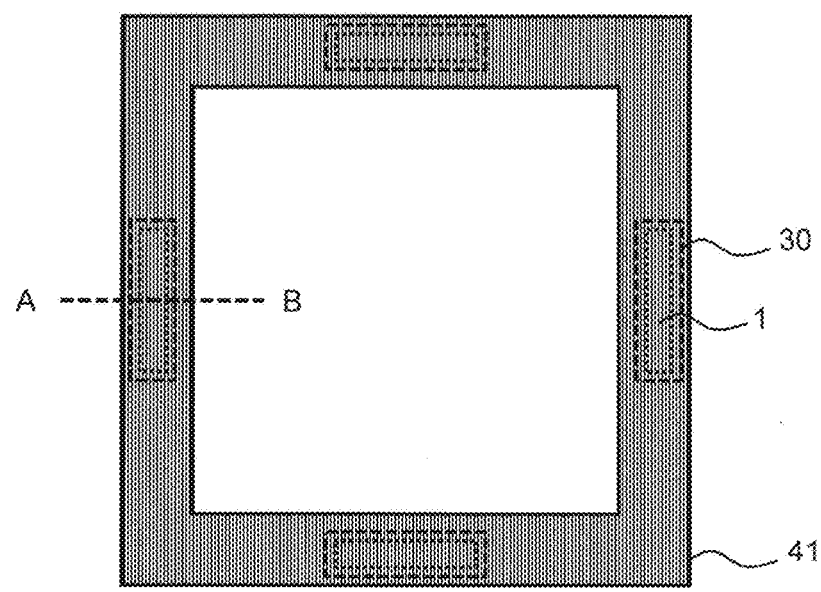
FIG. 24A is a schematic diagram of a support frame 111I according to Embodiment 4 and shows a top view showing the position of a filter 30 by a dotted line.
Figure 24B:
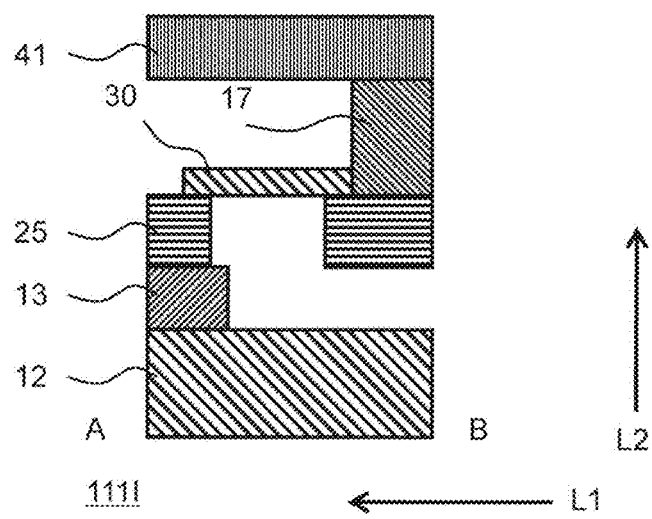
FIG. 24B shows a cross-sectional view of the AB-line in FIG. 24A.

FIGS. 24A and 24B are schematic diagrams showing a support frame 111I according to an embodiment of the present invention. FIG. 24A is a top view of the support frame 111I in which the filter 30 is arranged in the frame body, and FIG. 24B is a cross-sectional view of the support frame 111I at a position where the filter 30 is arranged (line segment A B shown in FIG. 24A). In the Embodiment 6, in order from the side connected to the master plate, the bottom plate layer 12, the inner plate layer with vent hole 13, the spacer layer with through hole 25, the outer plate layer with vent hole 17, a top plate 41 are stacked to form the frame body. That is, the support frame 111I is also the support frame in which the top plate 41 is arranged in the above-mentioned support frame 111D. In FIG. 24A, since the top plate 41 is present, it is impossible to observe the filter 30 from the top surface, the location where the filter 30 is arranged in the lower layer is shown using a dotted line. The configurations of the bottom plate layer 12, the inner plate layer with vent hole 13, the spacer layer with through hole 25, and the outer plate layer with vent hole 17 can be the same as those of the above-described embodiment, and therefore detailed descriptions thereof are omitted.

Figure 25A:
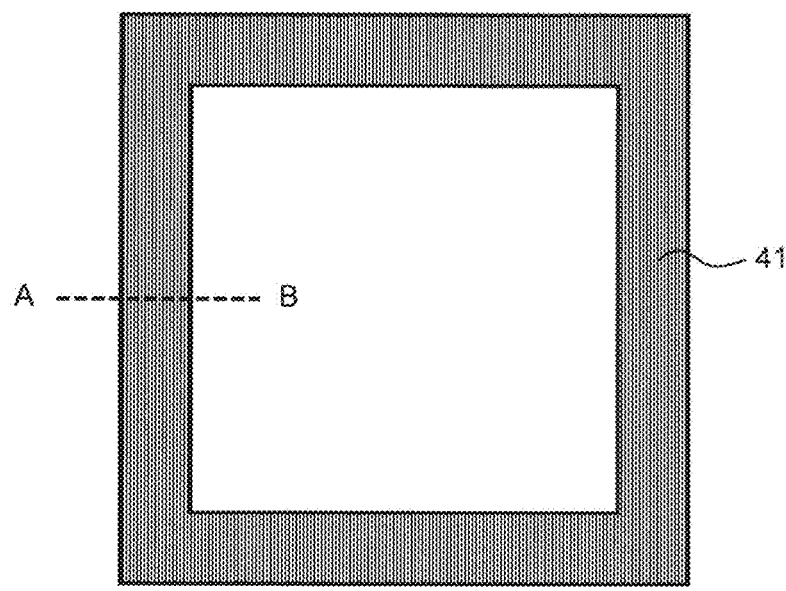
FIG. 25A is a schematic diagram of a top plate 41 according to an embodiment and shows a top view.
Figure 25B:
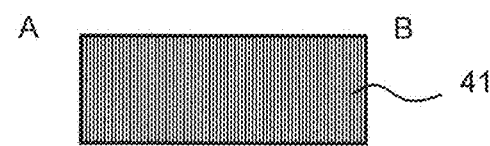
FIG. 25B shows a cross-sectional view of the AB-line in FIG. 25A.

FIGS. 25A and 25B are schematic diagrams showing the top plate 41 according to an embodiment of the present invention. FIG. 25A is top view of the top plate 41, FIG. 25B is cross-sectional view of the top plate 41 in the line segment AB. The top plate 41 may be a shape of a substantially rectangular frame shape, may be substantially the same shape as the bottom plate layer 12. The top plate 41 is connected over the outer plate layer with vent hole 17. The top plate 41 is connected to the pellicle film or the pellicle film body. In the Embodiment 6, since the connection with the pellicle film or the pellicle film body can be performed by the entire top plate, the connection strength can be increased. Further, since the filter 30 is covered with top the plate 41, the exposure light is less likely to hit the filter 30, it is possible to further suppress the degradation of the filter 30.

Modification of Embodiment 6

In Embodiment 6, the support frame 111I has been described as an example using the frame body in which the hole 3 extending in the first direction L1 is the inner edge vent of the frame body and the hole 5 extending in the second direction L2 intersecting with the first direction L1 is the outer edge vent of the frame body, but the support frame according to the present invention is not limited thereto. As described in the support frame 111 A, the frame body can also be used in which the hole 3 extending in the first direction L1 is the outer edge vent of the frame body and the hole 5 extending in the direction L2 intersecting the first direction L1 is the inner edge vent of the frame body.

Figure 26A:
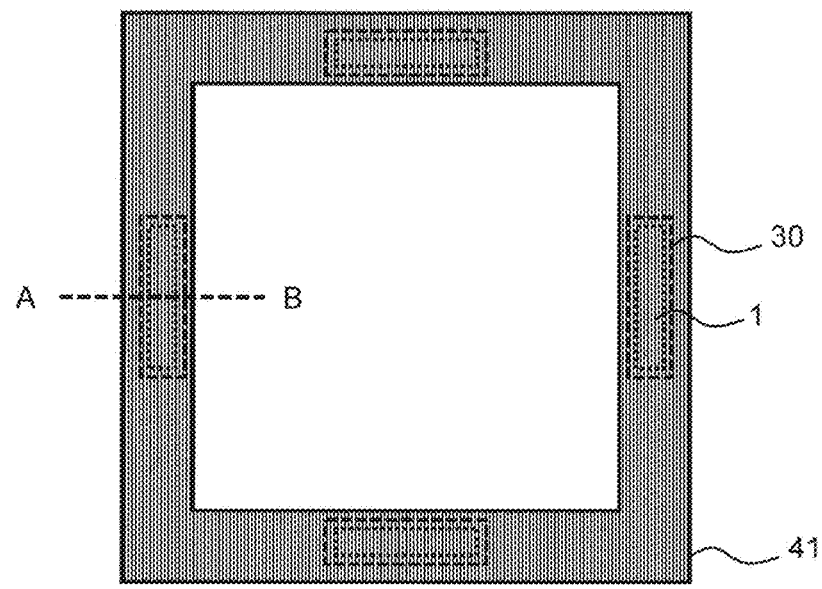
FIG. 26A is a schematic diagram of a support frame 111J provided with a top plate 41 according to a modification of an embodiment and shows a top view.
Figure 26B:
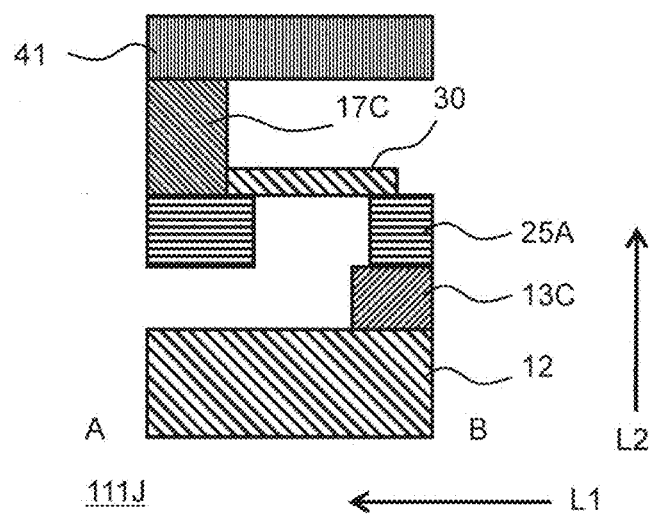
FIG. 26B shows a cross-sectional view of the AB-line in FIG. 26A.

FIGS. 26A and 26B are schematic diagrams showing a support frame 111J according to a modification. FIG. 26A is a top view of the support frame 111J in which the filter 30 is arranged in the frame body, and FIG. 26B is a cross-sectional view of the support frame 111J at a position in which the filter 30 is arranged (line segment AB shown in FIG. 26A). A modification of the Embodiment 6 is that the frame body is formed by stacking the bottom plate layer 12, the outer plate layer with vent hole 13C, the spacer layer with through hole 25A, the inner plate layer with vent hole 17C, and top plate 41 in order from the side connected to the master plate. That is, the support frame 111J is also the support frame in which the top plate 41 is arranged in the above-mentioned support frame 111E. In FIG. 26A, since the top plate 41 is present, it is not possible to observe the filter 30 from the top surface, and the location where the filter 30 is arranged in the lower layer is shown using a dotted line. The configurations of bottom plate layer 12, the outer plate layer with vent hole 13C, the spacer layer with through hole 25A, and the inner plate layer with vent hole 17C can be the same as those of the above-described embodiment, and therefore detailed descriptions thereof are omitted.

In this modification, since the pellicle film or the pellicle film body can be connected to the entire top plate to increase the bonding strength. Further, since the filter 30 is covered with the top plate 41, the exposure light is less likely to hit the filter 30, it is possible to suppress the degradation of the filter 30.

The top plate 41 can be arranged in the support frame described in all the embodiments described above, and can achieve the same effect as the effect described in the Embodiment 6 and the modification thereof.

Each embodiment may be combined. For example, in the Embodiment 3, the bottom plate layer 12, the inner plate layer with vent hole 13B, the spacer layer with through hole 25, the third spacer layer 48, and the outer plate layer with vent hole 17 may be arranged in this order from the side connected to the master plate, and the filter 30 may be interposed between the spacer layer 25 and the third spacer layer 48. Therefore, the second spacer layer 36 may be omitted. Further, in the Embodiment 1, the bottom plate layer 12, the inner plate layer with vent hole 13, the outer plate layer with vent hole 17 are stacked, the top plate 41 of the Embodiment 6 is arranged on the upper surface of the outer plate layer with vent hole 17, the filter 30 may be installed in the hole 5 configured with the inner plate layer with vent hole 13 and the outer plate layer with vent hole 17. In the Embodiment 3, the bottom plate layer 12, the inner plate layer with vent hole 13B, the spacer layer 25, the second spacer layer 36, and the outer plate layer with vent hole 17 may be stacked, the top plate 41 of the Embodiment 6 may be arranged on the upper surface of the outer plate layer with vent hole 17, and the filter 30 may be arranged between the spacer layer 25 and the second spacer layer 36. Therefore, the third spacer layer 48 may be omitted. In the Embodiment 3, the bottom plate layer 12, the inner plate layer with vent hole 13B, the spacer layer 25, the third spacer layer 48, and the outer plate layer with vent hole 17 may be the stacked, the top plate 41 of the Embodiment 6 may be arranged on the upper surface of the outer plate layer with vent hole 17, and the filter 30 may be interposed between the spacer layer 25 and the third spacer layer 48. Therefore, the second spacer layer 36 may be omitted.

The inner plate layer with vent hole 13B or the outer plate layer with vent hole 13E described in the Embodiment 5 and the modification of the Embodiment 5 may be applied to the inner plate layer with vent hole or the outer plate layer with vent hole arranged between the bottom plate layer 12 and the spacer layer in the respective embodiments described above. The bottom plate layer 12, the inner plate layer with vent hole 13, the outer plate layer with vent hole 17, the spacer layer with through hole 25, the second spacer layer 36, the third spacer layer 48, and the top plate 41 in the respective embodiments may be formed of a single thin plate, or may be formed by the stacking a plurality of thin plate having the same planar configuration.

[Pellicle]

The pellicle can be configured by arranging the pellicle film 102 or the pellicle frame body on the support frame shown in the above-described embodiments. Specifically, as an example, the pellicle film 102 may be formed on the upper surface of the outer plate layer with vent hole 17 described in Embodiment 1 or the inner plate layer with vent hole 17A described in the modification of Embodiment 1. As will be described later, since the pellicle film 102 according to the embodiment of the present invention is a very thin film, it is preferable that the pellicle frame body in which a first frame body is provided on one surface of the pellicle film 102 and the pellicle frame body is arranged on the support frame from the viewpoint of handling. The methods of connecting the pellicle film 102 or the pellicle frame body to the support frame are not particularly limited, and can be connected by a tackiness sheet, an adhesive, a bonding agent, a normal temperature welding, a direct bonding, an atomic diffusion bonding, a metallic bonding, a welding, a solder bonding, a thermocompression bonding, a hot melt, a flux bonding, a surface fastener, a van der Waals force, an electrostatic force, a magnetic force, and mechanical forces such as screw pins, clips, and crimping.

Figure 27A:
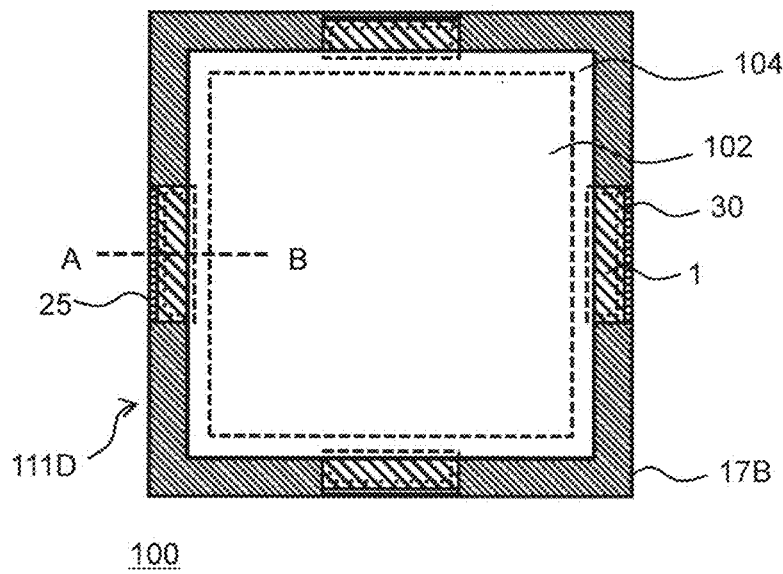
FIG. 27A is a schematic diagram of a pellicle 100 according to an embodiment shows a top view.
Figure 27B:
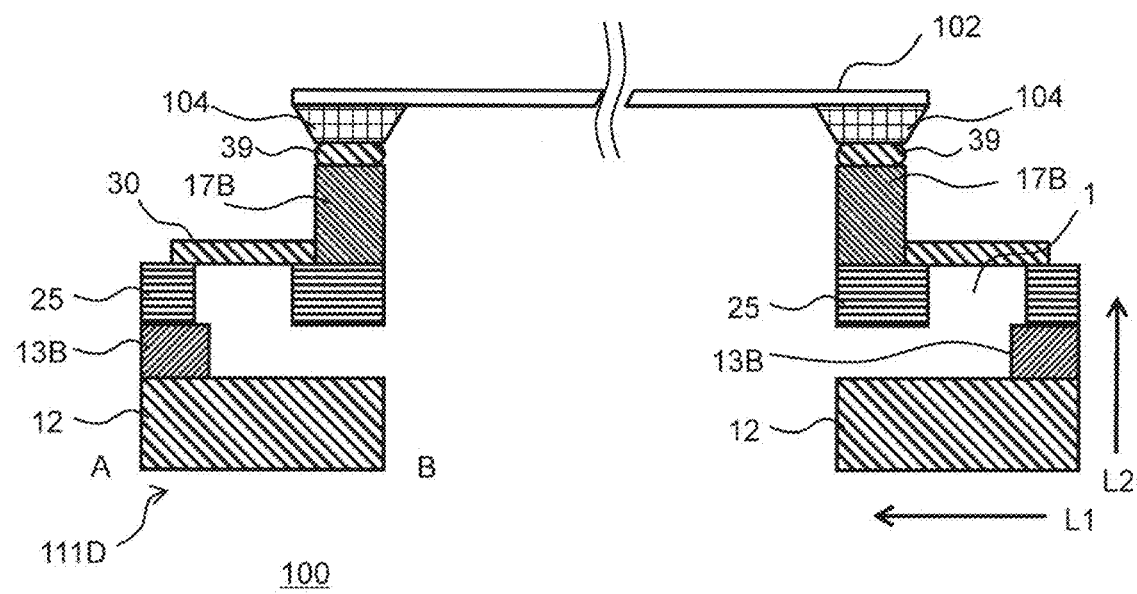
FIG. 27B shows a cross-sectional view of the AB-line in FIG. 27A.

FIGS. 27A and 27B are schematic diagrams showing a pellicle 100 according to an embodiment of the present invention. FIG. 27A is a top view of the pellicle 100, and FIG. 27B is a cross-sectional view of the pellicle 100 at a line segment AB shown in FIG. 27A. FIGS. 27A and 27B exemplarily show the pellicle 100 using the support frame 111D of the Embodiment 2. The pellicle film 102 is located on a first frame body 104. The first frame body 104 has a substantially rectangular frame shape, and is made of a material selected from silicon, sapphire, silicon carbide, and the like. The pellicle film 102 is extended on the first frame body 104, and the first frame body 104 supports the pellicle film 102. The structure in which the pellicle film 102 is arranged on the first frame body 104 is referred to as a pellicle frame body. In the pellicle 100, the pellicle frame body is applied to the upper surface of the outer plate layer with vent hole 17B of the support frame 111D via an adhesive layer 39. Therefore, in the present embodiment, the pellicle film 102 is provided on the support frame 111D via the first frame body 104 arranged on one side of the pellicle film 102. In the present embodiment, although the support unit has the first frame body 104 supporting the pellicle film 102 and the second frame body constituting the support frame 111D, the present embodiment is not limited to this, and the pellicle film 102 may be arranged on the support frame 111D without the first frame body 104.

An adhesive layer 39 is a layer for bonding the pellicle film or the first frame body and the support frame. The adhesive layer 39 is, for example, a double-sided tackiness tape, a silicone-resin tackiness agent, an acrylic-based tackiness agent, a polyolefin-based tackiness agent, an inorganic-based adhesive, or the like. From the viewpoint of maintaining the degree of the vacuuming at the time of the EUV exposure, it is preferable that the adhesive layer 39 has a small amount of outgassing. As a method of evaluating the outgas, for example, a temperature-raised desorption gas analyzer can be used. The adhesive layer 39 may be pre-formed into the support frame prior to connecting the pellicle film or the first frame body to the support frame. The adhesive layer 39 may be formed on a layer arranged at a side closest to the pellicle film of the support frame layer.

In the pellicle 100 according to the present embodiment, since the filter 30 is arranged on the outer side of the region in which the pellicle film 102 is arranged, the EUV light does not easily hit the filter 30, and the degradation of the filter 30 can be reduced. Therefore, the frequency of replacing the filter 30 can be reduced.

[Modification of the Pellicle]

Also, as described in the above embodiment, the frame body can be used in which the hole 3 extending in the first direction L1 is the outer edge vent of the frame body, and the hole 5 extending in the second direction L2 intersecting the first direction L1 is the inner edge vent of the frame body.

Figure 28A:
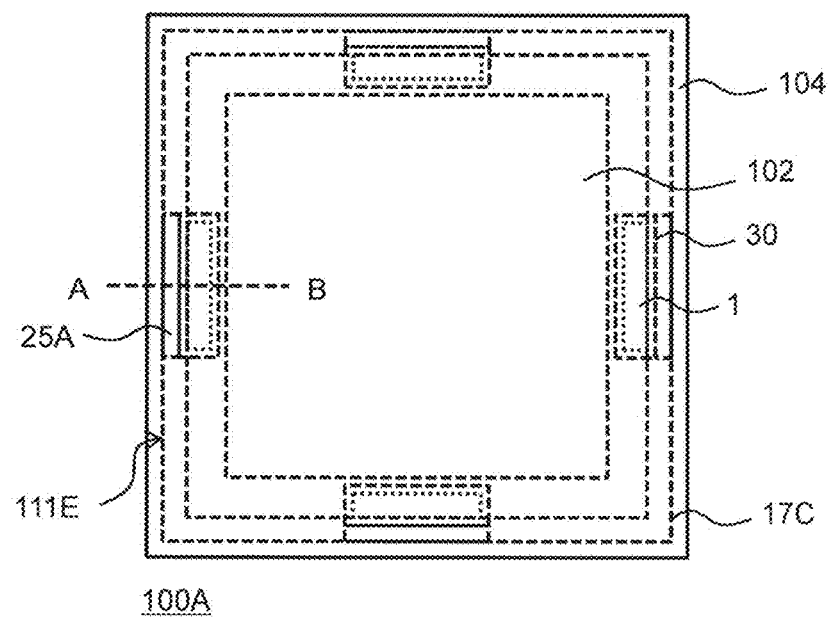
FIG. 28A is a schematic diagram of a pellicle 100A according to a modification of an embodiment and shows a top view.
Figure 28B:
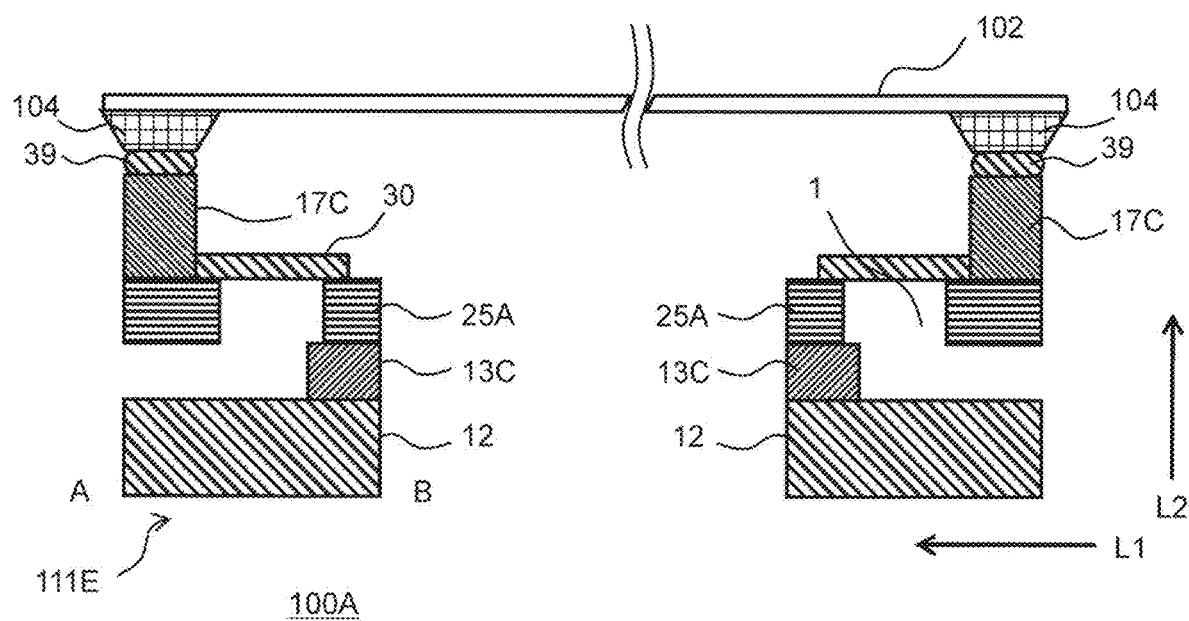
FIG. 28B shows a cross-sectional view of the AB-line in FIG. 28A.

FIGS. 28A and 28B are schematic diagrams showing a pellicle 100A according to an embodiment of the present invention. FIG. 28A is a top view of the pellicle 100A, and FIG. 28B is a cross-sectional view of the pellicle 100A at the line segment A B shown in FIG. 28A. FIGS. 28A and 28B show, as an example, the pellicle 100A using the support frame 111E according to a modification of the Embodiment 2. The configurations of the pellicle film 102, the first frame body 104, and the pellicle frame body can be the same as those described above, and thus detailed descriptions thereof are omitted. In the pellicle 100A, the pellicle frame body is affixed to the upper surface of the inner plate layer with vent hole 17C of the support frame 111E, via the adhesive layer 39. Therefore, in this modification, the pellicle film 102 is arranged on the support frame 111E via the first frame body 104 arranged on one side of the pellicle film 102. In the present embodiment, the support unit has the first frame body 104 supporting the pellicle film 102 and the second frame body constituting the support frame 111E, but the present embodiment is not limited to this, and the pellicle film 102 may be arranged on the support frame 111E without the first frame body 104.

In the pellicle 100A according to the present modification, the filter 30 is arranged in a region which the pellicle film 102 is arranged. Therefore, although there is a possibility that the filter 30 is irradiated with the EUV light that has passed through the pellicle film 102, since the amount of the EUV light is reduced by passing through the pellicle film 102, the degradation of the filter 30 is reduced. By setting the size (width) of the pellicle 100A so that the filter 30 is arranged at the position sufficiently distant from the exposure region of the master plate, it becomes difficult for the EUV light to hit the filter 30, and the degradation of the filter 30 can be further reduced. Therefore, the frequency of replacing the filter 30 can be reduced. The pellicle according to the present embodiment can be configured using the support frame of the above-described embodiments.

[Pellicle Film]

The thickness of the pellicle film (total thickness when composed of two or more layers) can be, for example, 10 nm to 200 nm, preferably 10 nm to 100 nm, more preferably 10 nm to 70 nm, and particularly preferably 10 nm to 50 nm.

The pellicle film preferably has a high transmittance of the EUV light, and the transmittance of the light used for the EUV lithography (for example, light having a wavelength of 13.5 nm or light having a wavelength of 6.75 nm) is preferably 50% or more, more preferably 80% or more, and still more preferably 90% or more. When the pellicle film is stacked with protective layer, it is preferable that the transmittance of the films containing these is 50% or more.

As a material of the pellicle film, a known material of the pellicle film for the EUV may be used. Examples of the materials of the pellicle film include carbon-based materials such as carbon nanotubes, diamond-like carbon, amorphous carbon, graphite, and silicon carbide, silicon-based materials such as single-crystal silicon, polycrystalline silicon, and amorphous silicon, and polymer-based materials such as aromatic polyimides, aliphatic polyimides, cross-linked polyethylenes, cross-linked polystyrenes, polyetherim ides, polyphenylene sulfones, polyphenylene ethers, polyethersulfones, polyetherketones, liquid crystal polymers, polyethylene terephthalates, aromatic polyamides, and parylene.

[Exposure Master Plate]

Figure 29:
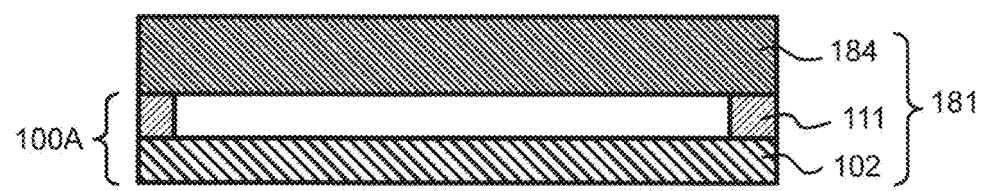
FIG. 29 is a schematic diagram for showing a pellicle, and an exposure master plate, according to an embodiment.

FIG. 29 is a schematic diagram showing a cross-sectional configuration of an exposure master plate 181 according to an embodiment of the present invention. The exposure master plate 181 includes the pellicle 100 including the pellicle film 102 and the support frame 111, and a master plate 184. The exposure master plate 181 according to the present invention, in the pellicle 100 provided with the pellicle film 102 for the extreme ultraviolet light lithography attached on the master plate 184, can attach and detach the filter 30 provided on the vent hole of the support frame 111, and reduce the contamination to the master plate 184. Although FIG. 29 shows an example in which the pellicle 100 including the pellicle film 102 and the support frame 111 is arranged on the surface of the patterned master plate 184, the present exposure master plate is not limited to this, and the pellicle 100A may be arranged, and the pellicle having the support frame described in the above embodiments may be arranged.

A method of attaching the pellicle to the master plate is not particularly limited. For example, the support frame may be directly attached to the master plate, may be via the master plate glue layers on one end surface of the support frame, or may use a mechanically securing method or attractive forces such as magnets or the like. The same adhesive layers as those of the adhesive layer 39 can be used for the adhesive layers for the master plate, and thus detailed description thereof is omitted.

[Use of Pellicle]

The pellicle may be a protective member for protecting the master plate during storage of the master plate and transportation of the master plate, as well as a protective member for preventing foreign matter from adhering to the master plate in the EUV exposure device. For example, if the pellicle is attached to the master plate (the exposure master plate), the pellicle can be removed from the EUV exposure device and stored as it is. Methods of attaching the pellicle to master plate include adhesively attaching the pellicle, mechanically fixing the pellicle, and the like.

[Exposure Device]

Figure 30:
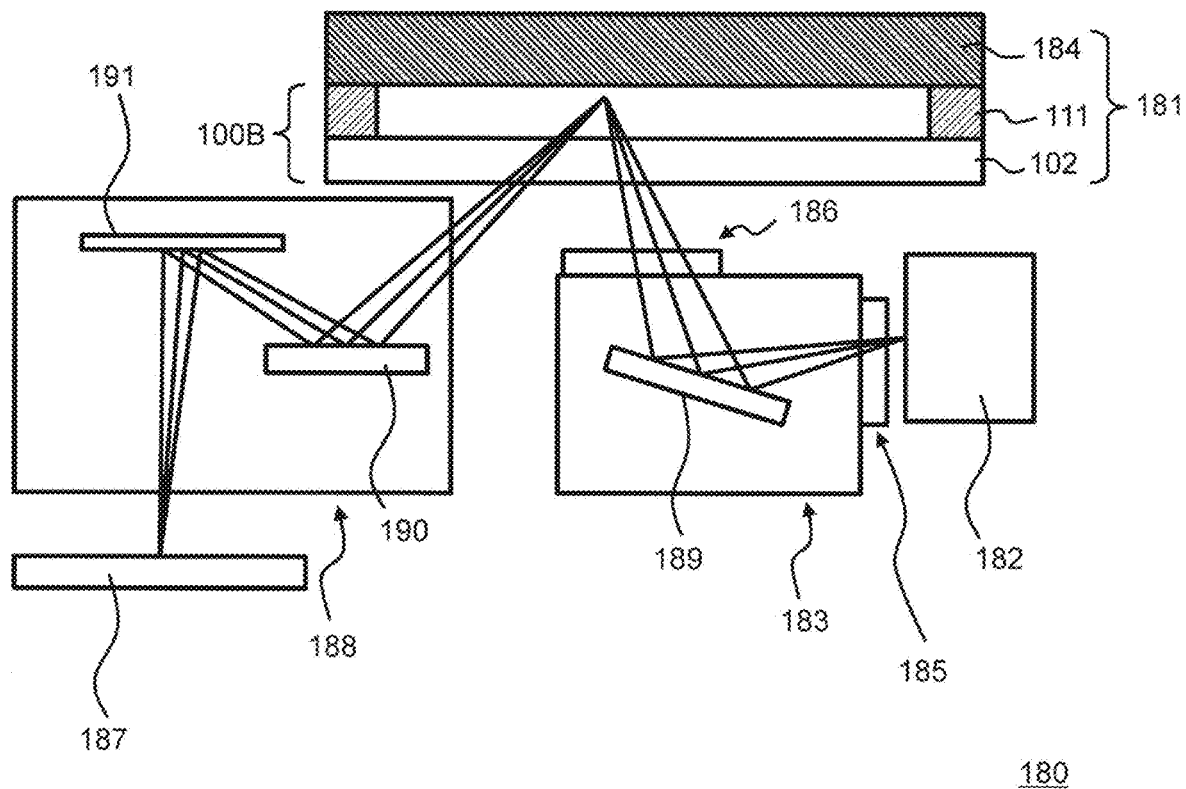
FIG. 30 is a schematic diagram for showing an exposure device and a method of manufacturing a semiconductor device according to an embodiment.

FIG. 30 is a schematic diagram showing an exposure device 180 according to an embodiment of the present invention. In FIG. 30, the exposure master plate 181 is shown by cross-sectional view.

As an example, the EUV exposure device 180 includes a light source 182 that emits the EUV light, the exposure master plate 181 that is an example of the exposure master plate of the present embodiment, and a lighting optical system 183 that directs the EUV light emitted from the light source 182 to the exposure master plate 181.

In the EUV exposure device 180, the EUV light emitted from the light source 182 is condensed by the lighting optical system 183 to uniformize the illuminance, is irradiated to the exposure master plate 181. The EUV light irradiated on the exposure master plate 181 is reflected in a pattern by the master plate 184.

The exposure master plate 181 is an exemplary exposure master plate of the present embodiment. It is arranged such that the EUV light emitted from the light source 182 is transmitted through the pellicle film 102 and irradiated to the master plate 184. The master plate 184 reflects the irradiated EUV-light in a pattern.

The lighting optical system 183 includes a plurality of multilayer film mirror 189, 190, 191 and optical couplers (optical integrators) for adjusting the optical path of the EUV light.

The light source 182 and the lighting optical system 183 can use known light source and lighting optical system.

In the EUV exposure device 180, filter windows 185 and 186 are installed between the light source 182 and the lighting optical system 183 and between the lighting optical system 183 and the master plate 184, respectively. The filter windows 185 and 186 are capable of capturing scattered particle. The EUV exposure device 180 also includes a projection optical system 188 that directs the EUV-light reflected by the master plate 184 to a sensitive substrate 187.

Since the filter is detachably provided on the vent hole and the pellicle provided with the pellicle film for the extreme ultraviolet light lithography is connected to the exposure master plate, the exposure device according to an embodiment of the present invention can reduce the effect on the optical system of the exposure device.

Although FIG. 30 shows an example in which the exposure master plate 181 in which the pellicle 100B including the pellicle film 102 and the support frame 111 is arranged on the surface of the patterned master plate 184 is arranged in the EUV exposure device 180, the EUV exposure device according to the present invention is not limited to this, and an exposure master plate 181 in which the pellicle 100 or the pellicle 100A is arranged may be arranged in the EUV exposure device 180, and the exposure master plate 181 using the pellicle having the support frame described in the above embodiments may be arranged in the EUV exposure device 180.

The exposure device of the present embodiment preferably comprises a light source for emitting an exposure light (preferably the EUV light or the like, more preferably the EUV light; the same shall apply hereinafter); the exposure master plate of the present embodiment, and a optical system for directing the exposure light emitted from the light source to the exposure master plate, and the exposure master plate is arranged such that the exposure light emitted from the light source is transmitted through the pellicle film and irradiated onto the master plate.

According to this aspect, in addition to being able to form a pattern miniaturized by the EUV light or the like (e.g., line width 32 nm or less), even when using the EUV light which has a problem in poor resolution due to the foreign matter, pattern exposure in which poor resolution due to foreign matter is reduced can be performed.

[Manufacturing Method of Semiconductor Device]

A manufacturing method of the semiconductor device of the present embodiment includes the steps of transmitting an exposure light emitted from a light source through the pellicle film of the exposure master plate of the present embodiment and irradiating the exposure light to the master plate, and transmitting the exposure light reflected by the master plate through the pellicle film and irradiating the exposure light on a sensitive substrate, and thereby exposing the sensitive substrate in patterned shape.

According to the manufacturing method of the semiconductor device of the present embodiment, even when using the EUV light which has a problem in poor resolution due to the foreign matter, semiconductor device in which poor resolution due to the foreign matter is reduced can be produced. For example, by using the exposure device according to the present embodiment, it is possible to perform the manufacturing method of the semiconductor device according to the present embodiment.

According to the manufacturing method of the semiconductor device according to the embodiment of the present invention, since the filter is detachably provided on the vent hole and the pellicle provided with pellicle film for the extreme ultraviolet light lithography is connected to the exposure master plate, it is possible to perform a high-definition exposure in the extreme ultraviolet light lithography.

According to the present invention, provided are a support frame in which a vent hole and a filter are arranged and a pellicle film for the extreme ultraviolet light lithography can be arranged, a pellicle in which the pellicle film for the extreme ultraviolet light lithography arranged on the support frame, and a method of manufacturing the same, an exposure master plate using these, and a method of manufacturing the semiconductor device.

What is claimed is:

1. A support frame for arranging a pellicle film, comprising
    one or more of through holes being made from a first hole extending along a first direction, the first direction being substantially parallel to a surface direction of the pellicle film, and a second hole extending along a second direction, the second direction intersecting with the first direction;
    one or more of filters arranged at an inside of the through hole or at an end of the through hole, and the filter being arranged apart from the pellicle film, and
    a plurality of layers, the plurality of layers including:
        a bottom plate being in a frame shape;
        a first thin plate being in a frame shape; and
        a second thin plate being a frame shape, the first and second thin plates arranged above the bottom plate,
    wherein the first thin plate has one or more of first concave parts connected to an inner edge of the first thin plate and extending along the first direction,
    the second thin plate has one or more of second concave parts connected to an outer edge of the second thin plate and extending along the first direction, and
    the second hole extending to the second direction is formed by at least partially overlapping the first concave part and the second concave part.

2. The support frame according to claim 1, wherein the first thin plate is arranged on the bottom plate, and the second thin plate is arranged above the first thin plate.

3. The support frame according to claim 1, wherein the second thin plate is arranged on the bottom plate, and the first thin plate is arranged above the second thin plate.

4. The support frame according to claim 1, further comprising one or more spacer layers between the first thin plate and the second thin plate.

5. The support frame according to claim 4, wherein the first thin plate is arranged above the bottom plate, and the first thin plate has a plurality of the first concave parts extending to the first direction.

6. The support frame according to claim 4, wherein the second thin plate is arranged above the bottom plate, and the second thin plate has a plurality of the second concave parts extending to the first direction.

7. The support frame according to claim 1, wherein the support frame has a plurality of the through holes,
    the one or more of filters includes a plurality of filters,
    each of the plurality of the filters is arranged to each of the plurality of the through holes, and
    a total area of the plurality of the filters is 100 mm$^2$ or more and 2000 mm$^2$ or less.

8. The support frame according to claim 1, wherein the surface direction of one or more of the filters is substantially parallel to the surface direction of the pellicle film.

9. The support frame according to claim 1, wherein one or more of the filters has an initial pressure loss of 100 Pa or more and 550 Pa or less, and a particle capture rate of 99.7% or more and 100% or less for particle having a particle diameter of 0.15 μm or more and 0.3 μm or less.

10. The support frame according to claim 1, wherein a thickness of the support frame from a surface arranging the pellicle film to an opposite surface is 3.0 mm or less.

11. The support frame according to claim 1, wherein the support frame is used for lithography.

12. A pellicle, wherein the pellicle film is arranged to the support frame according to claim 1.

13. The pellicle according to claim 12, wherein the pellicle film is arranged to the support frame through a frame body arranged on one surface of the pellicle film.

14. An exposure master plate comprising:
a master plate;
the pellicle according to claim 12, the pellicle attached on a surface of the master plate with a pattern.

15. An exposure device comprising:
the exposure master plate according to claim 14.

16. An exposure device comprising:
a light source for emitting an exposure light;
the exposure master plate according to claim 14; and
an optical system for guiding the exposure light emitted from the light source to the exposure master plate,
wherein the exposure master plate is arranged so that the exposure light emitted from the light source transmits the pellicle film and irradiates to the exposure master plate.

17. A method of manufacturing a semiconductor device, comprising steps of:
transmitting an exposure light emitted from a light source through the pellicle film of the exposure master plate according to claim 14, irradiating the exposure light to the master plate, and reflecting the exposure light on the master plate; and
transmitting the exposure light reflected by the master plate through the pellicle film, irradiating the exposure light on a sensitive substrate, and thereby exposing the sensitive substrate in patterned shape.

* * * * *